(12) United States Patent
Fukunaga et al.

(10) Patent No.: US 8,952,946 B2
(45) Date of Patent: Feb. 10, 2015

(54) DISPLAY PANEL, MODULE, AND ELECTRONIC DEVICE

(75) Inventors: Yoko Fukunaga, Kanagawa (JP); Tetsuro Ochi, Kanagawa (JP); Daisuke Takama, Kanagawa (JP); Yasuyuki Matsui, Kanagawa (JP)

(73) Assignee: Sony Corporation, Tokyo (JP)

( * ) Notice: Subject to any disclaimer, the term of this patent is extended or adjusted under 35 U.S.C. 154(b) by 1243 days.

(21) Appl. No.: 12/643,598

(22) Filed: Dec. 21, 2009

(65) Prior Publication Data
US 2010/0164906 A1    Jul. 1, 2010

(30) Foreign Application Priority Data
Dec. 25, 2008  (JP) ................... 2008-329918

(51) Int. Cl.
G09G 3/36    (2006.01)
G06F 3/041   (2006.01)
G06F 3/042   (2006.01)

(52) U.S. Cl.
CPC .............. *G06F 3/0412* (2013.01); *G06F 3/042* (2013.01)
USPC ............... 345/207; 345/81; 345/87; 345/84; 313/489; 349/115

(58) Field of Classification Search
USPC .............. 345/87, 173, 84, 81, 207; 349/1–12, 349/115; 313/489
See application file for complete search history.

(56) References Cited

U.S. PATENT DOCUMENTS

| | | | | |
|---|---|---|---|---|
| 5,847,792 A * | 12/1998 | Kobayashi et al. | ........... | 349/110 |
| 7,598,949 B2 * | 10/2009 | Han | ............... | 345/204 |
| 7,714,959 B2 * | 5/2010 | Maeda | ........... | 349/110 |
| 8,008,613 B2 * | 8/2011 | Tam | ............... | 250/226 |
| 8,085,256 B2 * | 12/2011 | Sakamoto et al. | ........... | 345/207 |
| 2002/0175900 A1 * | 11/2002 | Armstrong | .................... | 345/173 |
| 2004/0212747 A1 * | 10/2004 | Saitoh et al. | ..................... | 349/6 |
| 2006/0103637 A1 | 5/2006 | Yamaguchi et al. | | |
| 2006/0244693 A1 | 11/2006 | Yamaguchi et al. | | |
| 2007/0008298 A1 * | 1/2007 | Ohta | ............... | 345/173 |
| 2007/0120833 A1 | 5/2007 | Yamaguchi et al. | | |
| 2008/0122803 A1 * | 5/2008 | Izadi et al. | ..................... | 345/175 |
| 2008/0174530 A1 * | 7/2008 | Booth et al. | .................... | 345/82 |
| 2008/0246741 A1 * | 10/2008 | Hinata | .......................... | 345/173 |
| 2008/0252617 A1 * | 10/2008 | Nakamura et al. | ........... | 345/175 |
| 2009/0027319 A1 * | 1/2009 | Chen | .............................. | 345/87 |
| 2009/0128529 A1 * | 5/2009 | Izumi et al. | .................. | 345/207 |
| 2009/0179880 A1 * | 7/2009 | Nakajima et al. | ............ | 345/207 |

FOREIGN PATENT DOCUMENTS

| | | |
|---|---|---|
| JP | 2006-127212 | 5/2006 |
| JP | 2006-301864 | 11/2006 |
| JP | 2007-128497 | 5/2007 |

* cited by examiner

*Primary Examiner* — Jason Olson
*Assistant Examiner* — Linh N Hoffner
(74) *Attorney, Agent, or Firm* — Sony Corporation

(57) ABSTRACT

A display panel, ensuring high photo-detection accuracy in a region near a frame area, is provided. The display panel includes: image display elements disposed in an effective display area of a display screen; a light-shielding layer disposed in a frame area around the effective display area; and photo-detection elements disposed in the effective display area or in both of the effective display area and the frame area. The photo-detection elements detect the invisible light. The light-shielding layer transmits invisible light, while shields visible light.

19 Claims, 26 Drawing Sheets

WHEN VOLTAGE IS APPLIED (WHITE)

WHEN VOLTAGE IS NOT APPLIED (BLACK)

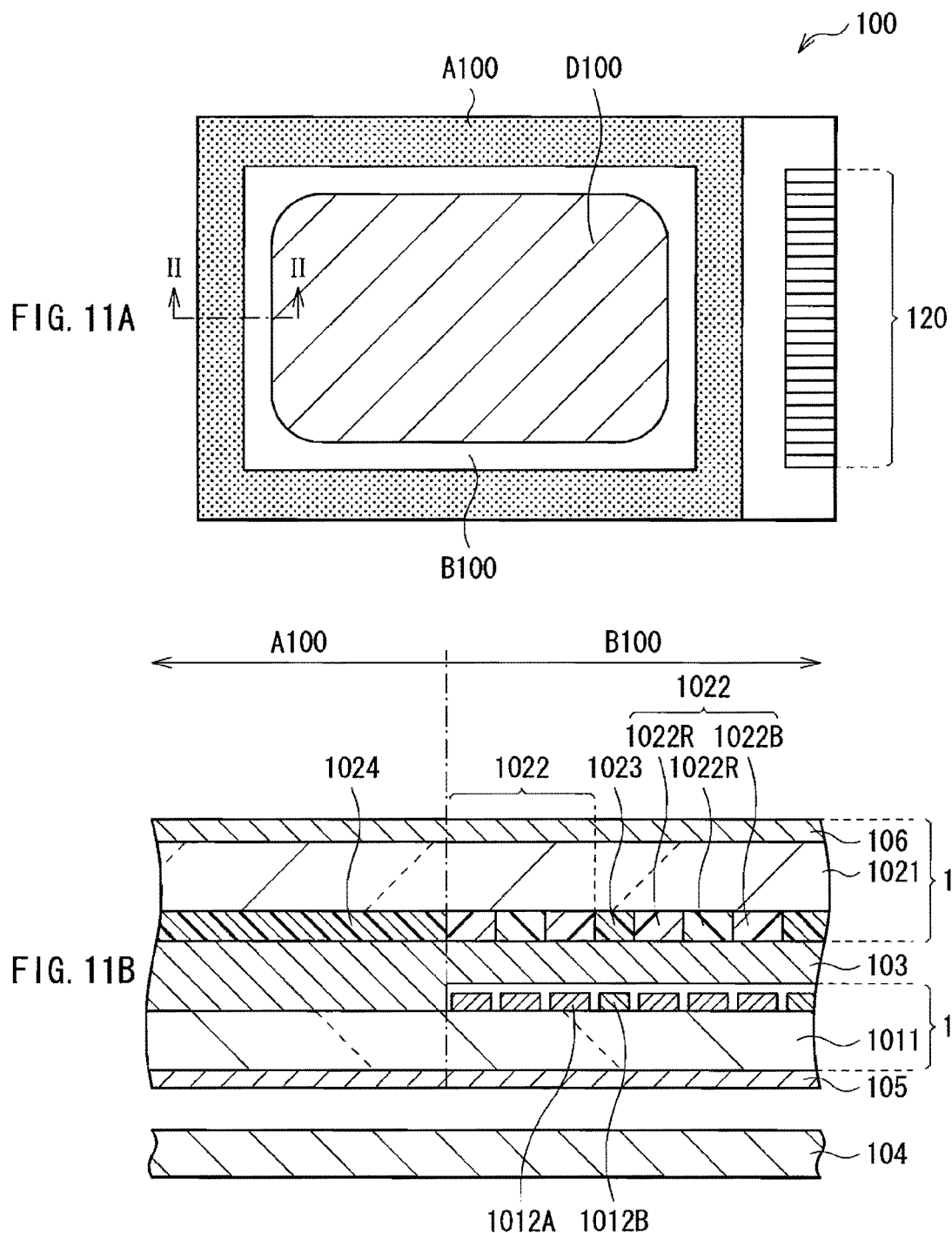

DISPLAY PANEL, MODULE, AND ELECTRONIC DEVICE

BACKGROUND OF THE INVENTION

1. Field of the Invention

The present invention relates to a display panel that may display an image using a liquid crystal element, an organic EL element or the like, and may be inputted with a position of a user finger or the like, and relates to a module using the display panel, and an electronic device using the display panel.

2. Description of the Related Art

Recently, a display device, which is used for a mobile phone and a personal digital assistant (PDA), a digital still camera, a PC (Personal Computer) monitor, and a television, uses liquid crystal elements or organic electroluminescence (EL) elements for display pixels. Such display pixels are arranged on a substrate in a matrix pattern together with driving transistors such as TFT (Thin Film Transistors).

On the other hand, a display device (touch panel) is proposed, in which photosensors are fabricated in the same layer as the TFT, thereby a position of a user finger or stylus may be detected (for example, Japanese Unexamined Patent Applications, Publication No. 2006-127212 and Publication No. 2007-128497). However, each of the display devices described in the Patent Application Publications uses a shadow formed by outside light or image display light to recognize a position of a finger or the like. Therefore, position detection has been hardly performed in the dark, or hardly performed when a display device emits no light, namely, in the case of black display.

SUMMARY OF THE INVENTION

Thus, a method is proposed, where invisible light (ultraviolet light or infrared light) is used as position detection light instead of outside light or image display light (for example, refer to Japanese Unexamined Patent Application, Publication No. 2006-301864). In such a display device, a frame area is formed surrounding an effective display area for performing image display. In the effective display area, photosensors detecting invisible light are provided in addition to image display elements, and a shielding layer is formed in the frame area. According to such a configuration, while image display is performed based on visible light, invisible light, which has been reflected and diffused from a surface of an object, is detected by the photosensors, so that a position of the object is specified.

However, in the above display device, photo-detection intensity is lower in a region of the effective display area near a boundary with the frame area, so that photo-detection accuracy may not be sufficiently ensured in the region, which has been desired to be improved.

In view of the foregoing, it is desirable to provide a display panel in which high photo-detection accuracy may be ensured in a region near the frame area, a module using the display panel, and an electronic device using the display panel.

A display panel according to an embodiment of the invention includes image display elements disposed in an effective display area of a display screen; a light-shielding layer disposed in a frame area around the effective display area, the light-shielding layer transmitting invisible light while shielding visible light; and photo-detection elements disposed in the effective display area or in both of the effective display area and the frame area, the photo-detection elements detecting the invisible light. A module according to an embodiment of the invention includes a light source emitting the invisible light and the visible light, and the display panel of the embodiment of the invention described above. An electronic device according to an embodiment of the invention is mounted with the module of the embodiment of the invention described above.

In the display panel, the module, and the electronic device of the embodiments of the invention, an image is displayed in the effective display area by the image display elements, and when an object such as a finger or stylus is contacted or close to a top of a device, the invisible light is reflected and diffused from a surface of the object, and such reflected light is detected by the photo-detection elements. At that time, the shielding layer provided in the frame area around the effective display area transmits the invisible light while shielding the visible light. Thereby, when the object is contacted or close to a portion near the frame area, the invisible light from the light source and from the object are hard to be shielded by the shielding layer in the frame area.

According to the display panel, the module, and the electronic device of the embodiments of the invention, the photo-detection elements are disposed in the effective display area or in both of the effective display area and the frame area, and the shielding layer which transmits the invisible light and shields the visible light is provided in the frame area around the effective display area. Thus, even if an object is contacted or close to a portion near the frame area, the invisible light from the light source and from the object may be hard to be shielded in the frame area. At this time, since a certain distance exists between the photo-detection elements and a surface of the object, the photo-detection elements provided near the frame area also detect light reflected and diffused from the frame area side. Hence, the shielding layer in the frame area transmits the invisible light as above, so that it is possible to suppress reduction in photo-detection intensity particularly in a region of the effective display area near a boundary with the frame area. Therefore, it is possible to ensure high photo-detection accuracy in a region near the frame area.

BRIEF DESCRIPTION OF THE DRAWINGS

FIGS. 11A and 11B are views showing a schematic configuration of a display device according to a comparative example.

DETAILED DESCRIPTION OF THE PREFERRED EMBODIMENTS

Hereinafter, preferred embodiments of the invention will be described in detail with reference to drawings.

First Embodiment

Figure 1:
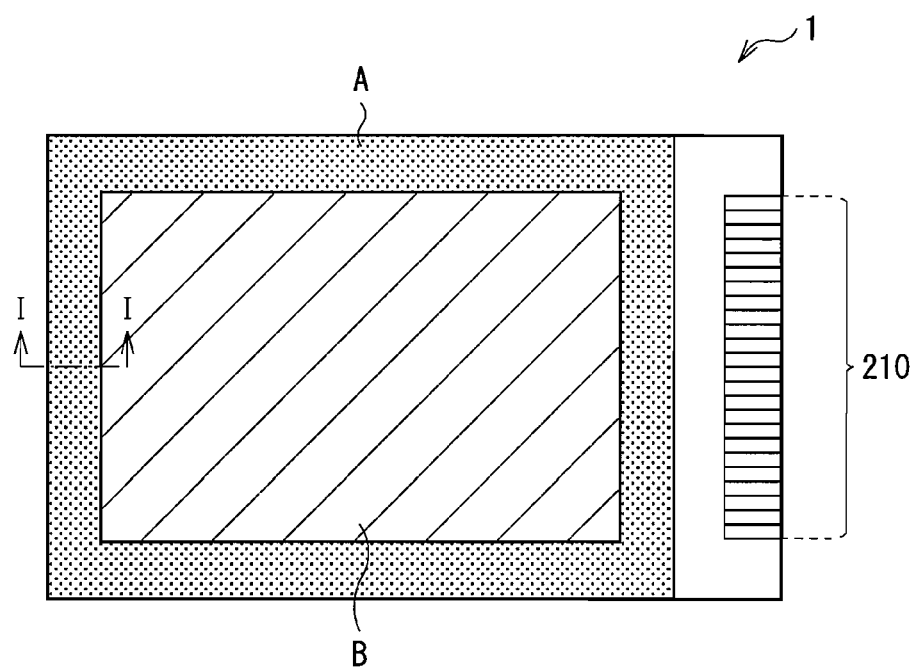
FIG. 1 is a schematic view showing a planar configuration of a display device according to a first embodiment of the invention.
Figure 2:
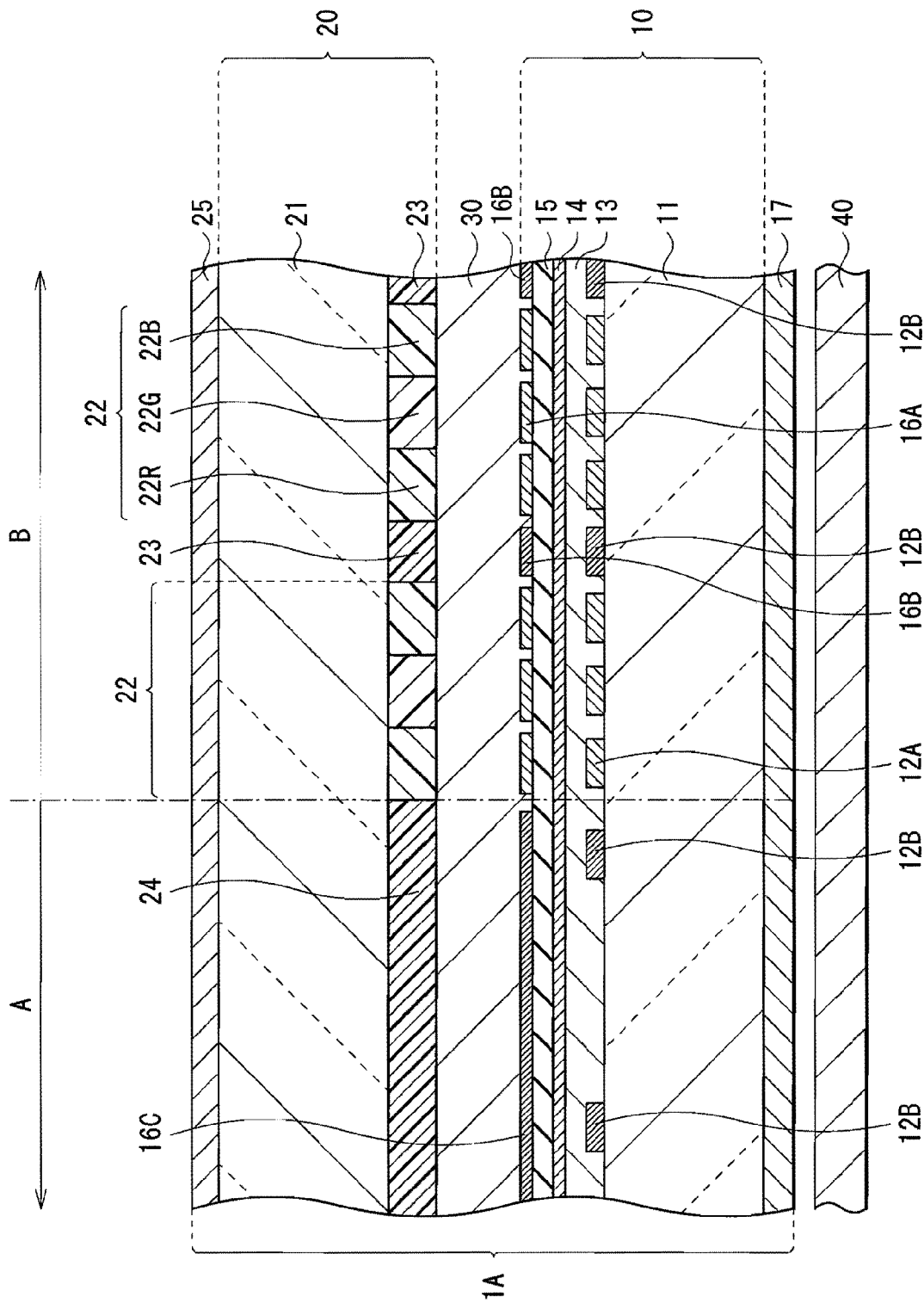
FIG. 2 is a section view showing a region near a boundary between a frame area and an effective display area of the display device shown in FIG. 1.

FIG. 1 is a schematic view of a display device 1 according to a first embodiment as viewed from a top (a display panel 1A side). FIG. 2 is a section view in an arrow direction along a line I-I of FIG. 1, showing a region near a boundary between a frame area A and an effective display area B. The display device 1 may output information on a position of a finger or the like being contacted or close to a top of a screen for displaying an image, and includes a display panel 1A, a backlight 40, and a position determination section (not shown). The display panel 1A has a rectangular, effective display area B in a display screen, and a frame area A is provided as an area around the area B. Such a display panel 1A has a region 210 at an end thereof, and, for example, lines on a TFT (Thin Film Transistor) substrate 10 are extended to the region and exposed therein, forming not-shown external connection terminals. The external connection terminals are connected with a flexible printed circuit board (FPC) (not shown) or the like for inputting/outputting a signal. An IC (Integrated Circuit) chip, which is integrated with various circuits, storage elements and the like, is provided on the FPC as a position determination section. Alternatively, the IC chip may be provided on lines of the TFT substrate 10, and FPC may be connected to an outer side of the IC chip.

Peripheral circuits (not shown) such as a signal line drive circuit and a scan line drive circuit to be drivers for image display are formed in the frame area A. In the effective display area B, for example, display pixels (image display elements) of three primary colors of R, G and B are arranged in a matrix pattern, and a liquid crystal element is used for each of the display pixels in the present embodiment. In the frame area A and the effective display area B, a liquid crystal layer 30 is enclosed between the TFT substrate 10 and a CF (Color Filter) substrate 20, and a backlight 40 is provided below the TFT substrate 10. A polarizing plate 17 is attached to the TFT substrate 10 on a light incidence side of the substrate 10, and a polarizing plate 25 is attached to the CF substrate 20 on a light outgoing side of the substrate 20. Hereinafter, a specific configuration of each of the TFT substrate 10, the CF substrate 20, the liquid crystal layer 30, and the backlight 40 is described for each of the areas.

Effective Display Area B

First, elements in the effective display area B are described. In the effective display area B, a plurality of TFTs 12A and a plurality of photosensors 12B (photo-detection elements) are arranged with certain pitches on a substrate 11 including glass or the like in the TFT substrate 10. The TFT 12A drive the display pixels, for example, by an active matrix method, and are connected to pixel electrodes 16A described later. Each photosensor 12B is a photo-detection device that may detect current or voltage when light is irradiated to a PN junction of a semiconductor, and for example, includes a PIN photodiode or PDN (Photo sensitive doped layer: P-doped-N) using a silicon semiconductor. The photosensors 12B are provided below invisible-light transmissive blacks 23 respectively.

The TFT 12A and the photosensors 12B may be formed in the same layer on the substrate 11 by the same thin film process, for example. A detailed configuration of each TFT 12A and that of each photosensor 12B are described later.

A planarization layer 13 is formed on the substrate 11 for planarizing irregularity on the TFT 12A and the photosensors 12B. A common electrode 14 and a plurality of pixel electrodes 16A are provided on the planarization layer 13 in a manner of being opposed to each other via an insulating layer 15. The common electrode 14 is provided as an electrode common to the display pixels, and the pixel electrodes 16A are arranged while being separated for each of the display pixels. In the present embodiment, the pixel electrodes 16A are patterned, for example, in a comb-like shape. Thus, the electrodes 16A are driven to achieve display in a transverse electric-field mode such as an FFS (Fringe Field Switching) mode or an IPS (In-plane Switching) mode in cooperation with the liquid crystal layer 30 as described later.

Black display electrodes 16B are provided in a region corresponding to invisible-light transmissive blacks 23 described later in the same layer as such pixel electrodes 16A. The black display electrodes 16B are provided facing the common electrode 14, and driven by a not-shown drive element to shield visible light entering the liquid crystal layer 30 to continuously achieve black display. That is, the electrodes 16B may be applied with a certain voltage to achieve black display by the liquid crystal layer 30. The black display electrodes 16B and a black display electrode 16C described later may be formed by the same process in the same layer as the pixel electrodes 16A. While the black display electrodes 16B may be provided to apply a voltage for black display as above, the voltage may be applied using the common electrode 14 without providing the black display electrodes 16B, for example, in the case of FFS mode.

In the CF substrate 20, color filter layers 22 and the invisible-light transmissive blacks 23 (second shielding layer) are periodically arranged on a surface of a substrate 21 including glass for example. Each color filter layer 22 includes, for example, a red color filter layer 22R, a green color filter layer 22G, and a blue color filter layer 22B, and the three-color color filter layers 22R, 22G and 22B are provided in correspondence to display pixels (pixel electrodes 16A). The invisible-light transmissive blacks 23, which act as a black matrix for shielding, are provided to improve display contrast. However, in the present embodiment, the invisible-light transmissive blacks 23 transmit invisible light while shielding visible light, and includes, for example, the same or similar material as that of a invisible-light transmissive black 24 described later.

The two polarizing plates 17 and 25 are disposed in crossed Nicols. The polarizing plate 17 is a polarizer selectively transmitting a particular polarizing component of visible light entering from a backlight 40 side to be incident on the liquid crystal layer 30. The polarizing plate 25 is an analyzer transmitting a polarizing component perpendicular to the light transmitted by the polarizing plate 17 so that display light is ejected above.

The liquid crystal layer 30 modulates light passing through the liquid crystal layer depending on a state of an electric field. For example, a liquid crystal of the transverse electric-field mode such as FFS mode or IPS mode may be used for the liquid crystal layer. The liquid crystal layer 30 is formed between the TFT substrate 10 and the CF substrate 20 while extending from the effective display area B up to the frame area A adjacent to the area B. A not-shown alignment film is formed between the liquid crystal layer 30 and the TFT substrate 10 and between the liquid crystal layer 30 and the CF substrate 20, respectively. The liquid crystal layer 30 is sealed by a not-shown seal layer at a circumferential portion of the frame area A.

Figure 3:
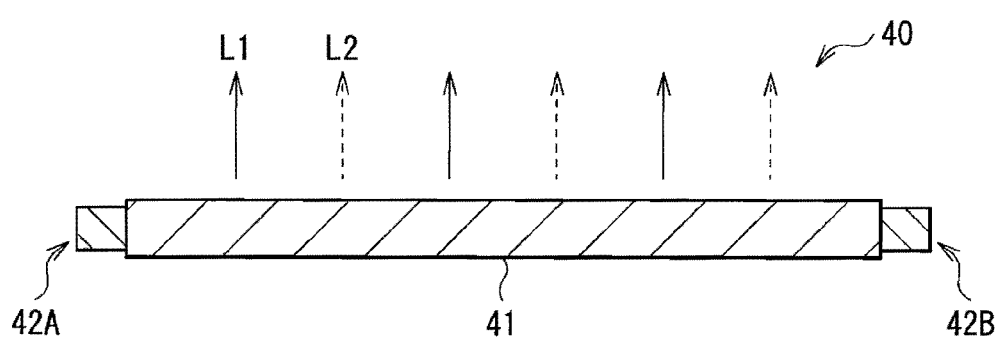
FIG. 3 is a view showing a schematic configuration of a backlight shown in FIG. 1.

The backlight 40 is a light source irradiating the display panel 1A, and disposed such that a light outgoing surface of the backlight is entirely opposed to surfaces of the effective display area B and the frame area A. The backlight 40 emits invisible light in addition to visible light. FIG. 3 shows a schematic section view of the backlight 40. As shown in the figure, the backlight 40 has, for example, an invisible light source 42A emitting invisible light L1, and a visible light source 42B emitting visible light L2 arranged at end positions of a flat light-guide plate 41 respectively. For example, a light emitting diode (LED) may be used for each of the light sources 42A and 42B. According to such a configuration, the invisible light L1 emitted from the light source 42A and the visible light L2 emitted from the light source 42B are propagated within the light guide plate 41 respectively, and then led out from a surface on a TFT substrate 10 side of the plate 41.

The invisible light L1 is light other than the visible light L2, namely, light of a wavelength in a range other than a visually sensitive wavelength range (for example, 380 nm to 780 nm). For example, the invisible light L1 is ultraviolet light on a short wavelength side or infrared light on a long wavelength side with respect to the visible light L2. It is particularly desirable to use light in a near ultraviolet region (300 nm to 380 nm) as the ultraviolet light, and use light in a near infrared region (780 nm to 1100 nm) matching with sensitivity of a Si photodiode as the infrared light. However, since the polarizing plates 17 and 25 provided on both sides of the display panel 1A have polarizing properties in visible and near ultraviolet regions, transmittance is correspondingly reduced and thus the amount of detected light is reduced in such regions, and besides the amount has dependence on image light modulated according to pixel potential. In contrast, in the near infrared region, since the polarizing properties are lost, reduction in amount of detected light may be suppressed, and besides the amount has no dependence on image light. Therefore, when a liquid crystal element having polarizing plates is used as in the present embodiment, near infrared light is desirably used as the invisible light.

Frame Area A

Next, elements in the frame area A are described. In the frame area A, photosensors 12B are arranged with certain pitches on the substrate 11 as in the effective display area B in the TFT substrate 10. The photosensors 12B are desirably arranged with even intervals from the frame area A up to the effective display area B. Particularly, when correction of barycenter described later is not performed, the photosensors 12B are more desirably arranged with an interval approximately equal to a distance from the photosensors to a surface of the polarizing plate 25 (module surface). This is because observed light is reflected and diffused from a surface of a finger or the like, and thus spreads over an area approximately corresponding to the distance from the photosensors to the module surface. The photosensors 12B are planarized by the planarization layer 13 extending from the effective display area B.

The common electrode 14 extends from the effective display area B on the planarization layer 13, and the black display electrode 16C is disposed facing the common electrode 14 via an insulating film 15 that also extends from the area B. The black display electrode 16C shields visible light entering the liquid crystal layer 30 to achieve continuous black display as in the case of the black display electrode 16B. Even in the case of the black display electrode 16C, the black display voltage may be applied using the common electrode 14 without providing the black display electrodes 16C, for example, in the FFS mode as in the case of the black display electrode 16B. Alternatively, only one of the black display electrodes 16B and 16C may be arranged. Furthermore, while the black display electrodes 16B and the black display electrode 16C may be independently driven, the electrodes may be driven together.

In the CF substrate 20, the invisible-light transmissive black 24 is formed on the substrate 21 over substantially the whole area of the frame area A. The invisible-light transmissive black 24 transmits invisible light while shielding visible light. However, the black 24 can be configured to selectively transmit invisible light even if the black does not perfectly shield visible light. It is enough that when infrared light is supplied from the backlight 40 as invisible light, the infrared light is selectively transmitted, and when ultraviolet light is supplied from the backlight 40 as invisible light, the ultraviolet light is selectively transmitted.

A pigment-dispersed resist may be used for the invisible-light transmissive black 24, for example, the resist including a pigment, which selectively transmits or shields light in a particular wavelength region, dispersed in a photosensitive resist material. The resist material includes acrylic material, polyimide material, and novolac material. The pigment includes a pigment having heat resistance and light resistance in a manufacturing process, and having a property of transmitting near infrared light in a form of a pigment-dispersed resist used for a color filter. Specifically, the pigment includes at least one of azo pigments of red, yellow and orange, phthalocyanine pigments of blue and green, and a dioxazine pigment of violet. Alternatively, an organic black pigment may be used. Such a pigment-dispersed resist is coated on the substrate 21, and then formed into the black 24 through a process of exposure, development, baking and the like. The invisible-light transmissive blacks 23 in the effective display area B may be formed by using the same or similar material and the same or similar process.

The liquid crystal layer 30 and the backlight 40 are the same as in or similar to the effective display area B.

Figure 4:
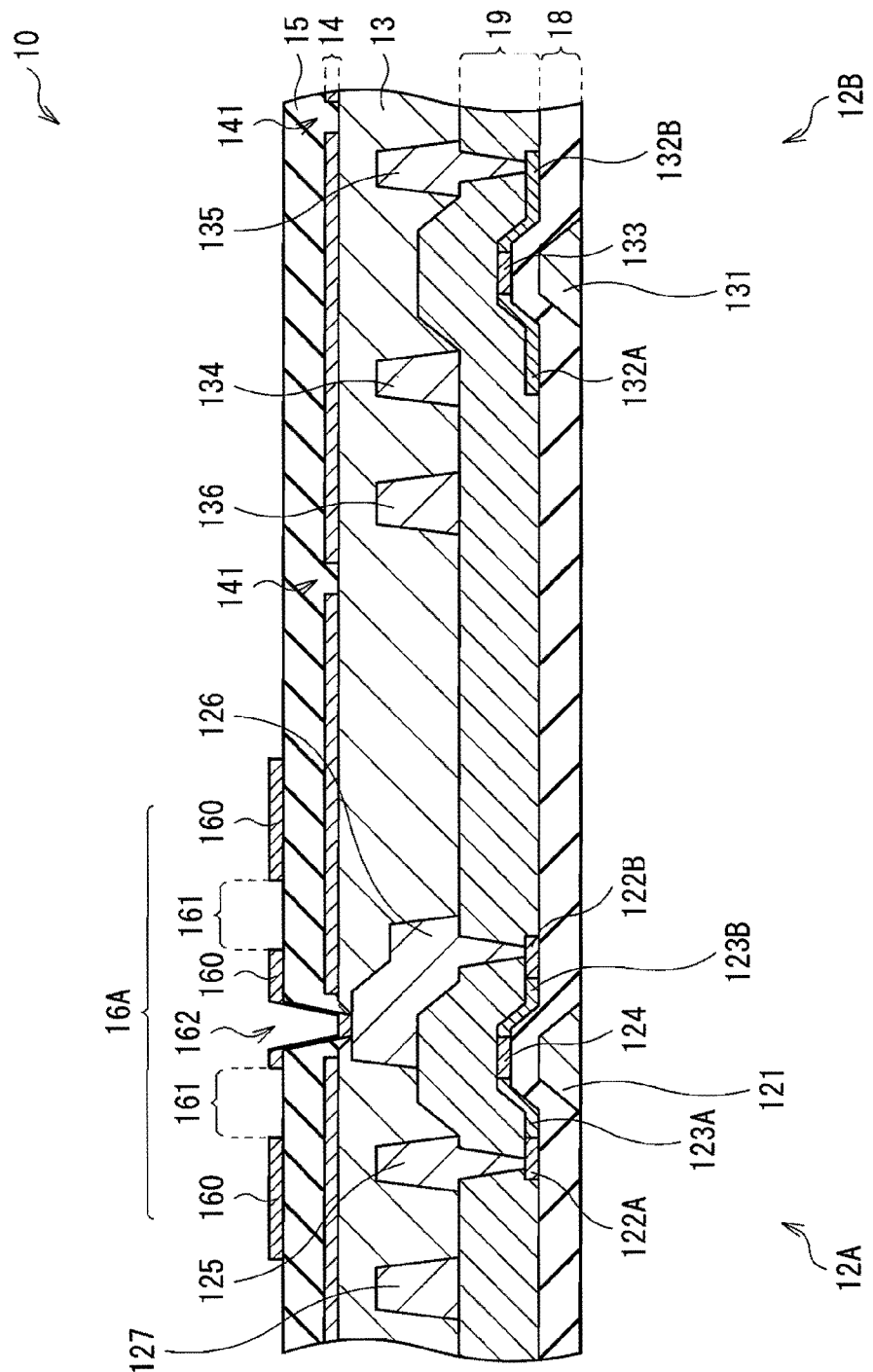
FIG. 4 is an enlarged section view of a portion near a boundary between TFT and a photosensor as shown in FIG. 1.
Figure 5:
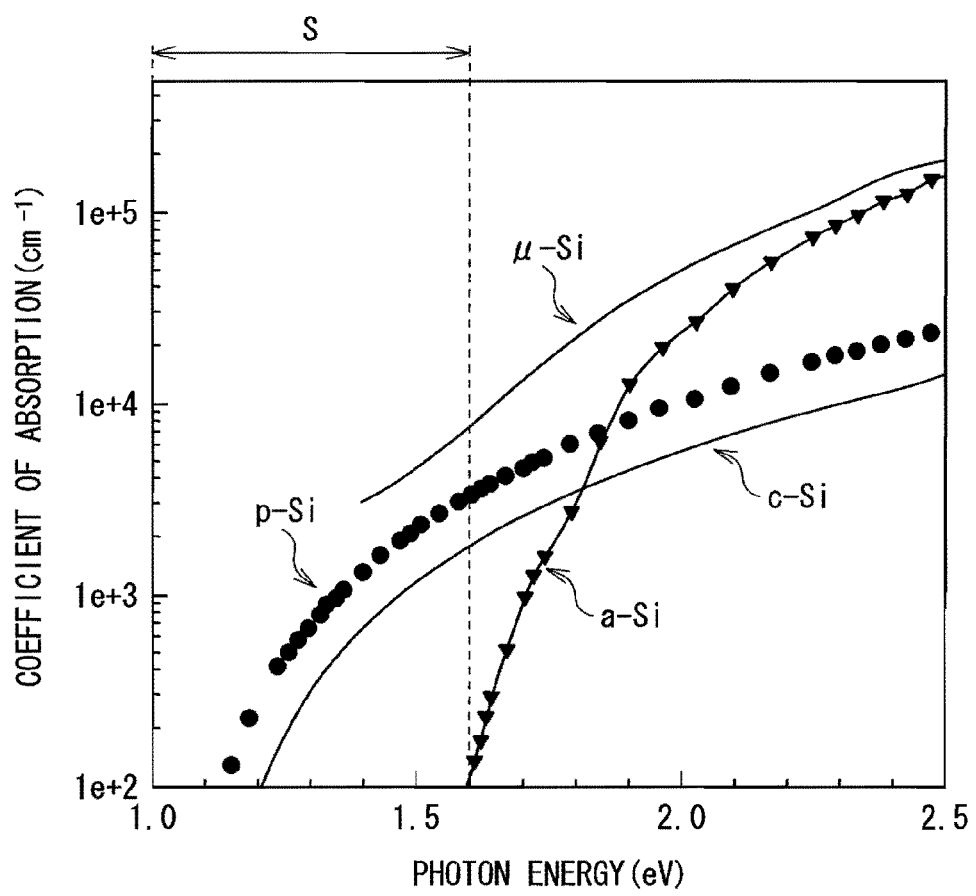
FIG. 5 is a characteristic diagram for illustrating light sensitivity of silicon semiconductors.

Next, a detailed configuration of the TFT substrate 10 is described with reference to FIGS. 4 and 5. FIG. 4 is an enlarged section view of a region of the TFT substrate 10 near a boundary between the TFT 12A and the photosensor 12B formed on the substrate 11 (not shown in FIG. 4). FIG. 5 is a characteristic diagram for illustrating photosensitivity of a silicon semiconductor. Hereinafter, description is made on elements of each of the TFT 12A and the photosensor 12B.

TFT 12A

In the TFT 12A, a pixel Tr gate 121 is provided on the substrate 11, and a gate insulating film 18 is formed covering the gate 121. A p$^-$ doped layer 124, LDD layers 123A and 123B, and N$^+$ doped layers 122A and 122B, the layers acting as a channel when the TFT is driven, are formed on the gate insulating film 18. The p$^-$ doped layer 124, the LDD layers 123A and 123B, and the N$^+$ doped layers 122A and 122B include a common material, for example, p-Si (polysilicon), and controlled in the amount of impurity doping respectively. The N$^+$ doped layers 122A and 122B are electrically connected to a source electrode 125 and a drain electrode 126 provided via an interlayer film 19 respectively. A display signal line 127 is further provided on the interlayer film 19, and the planarization layer 13 is formed covering the source electrode 125, the drain electrode 126 and the display signal line 127.

The common electrode 14 and the pixel electrode 16A are disposed on the planarization layer 13 via the insulating film 15. The common electrode 14 is electrically separated by a slit 141 into a portion on a pixel and a portion on a sensor, and electric potential different from pixel common potential is supplied to the portion on the sensor, thereby a liquid crystal layer 30 on the sensor may continuously display black. A planar shape of the pixel electrode 16A is a comb-like shape by slits 161 being repeatedly formed, and a transverse electric field may be applied to the liquid crystal layer 30 by potential difference between the comb-like electrode and the common electrode 14.

Photosensor 12B

In the photosensor 12B, a sensor gate 131 is provided on the substrate 11, and the gate insulating film 18 is formed covering the gate 131. A region 133, a p$^-$ doped layer 132A, and a N$^+$ doped layers 132B, those acting as an active region when the sensor is driven, are formed on the gate insulating film 18. The region 133, the p$^-$ doped layer 132A, and the N$^+$ doped layers 132B include a common material, for example, p-Si, and controlled in amount of impurity doping respectively. The N$^+$ doped layer 132B is electrically connected to a sensor source line 135 provided via the interlayer film 19. A GND line 134 and a sensor signal line 136 are further provided on the interlayer film 19, and the planarization layer 13 is formed covering the GND line 134, the sensor source line 135, and the sensor signal line 136. Thus, when light impinges to the region 133 while a reverse voltage is applied to a PN junction including the p$^+$ doped layer 132A, the region 133, and the N$^+$ doped layers 132B, carriers are separated so that a photocurrent is generated. This changes potential of an auxiliary capacitance (not shown) connected to the p$^+$ doped layer 132A, and the potential is read through the sensor signal line 136 electrically connected to the auxiliary capacitance.

Such a photosensor 12B includes the following silicon semiconductor: for example, polysilicon (p-Si), amorphous silicon (a-Si) and microcrystal silicon (μ-Si). A coefficient of absorption (cm$^{-1}$) with respect to photon energy (eV) of each silicon semiconductor has, for example, a characteristic as shown in FIG. 5. For example, when infrared light is used as the invisible light L1, polysilicon (grain size: several tens micrometers or more) or microcrystal silicon (grain size: several tens nanometers or more), which is sensitive to a region S (1.0 eV to 1.6 eV) corresponding to infrared light, is desirably used. In FIG. 5, C-Si indicates crystal silicon.

The position determination section (not shown) is provided in the IC chip on the lines on the FPC connected to the display panel 1A or the TFT substrate 10, as described before. The position determination section determines a position of an object (finger 2) based on output from the photosensors 12B. Specifically, the position determination section is formed by integrating a non-volatile memory storing a correction parameter such as module structure parameter, an AD converter performing analog/digital conversion of an output signal (analog signal) from the photosensors 12B, a volatile memory such as SRAM storing a digitalized image signal or a noise-removed image signal, and a logic operation circuit performing logic operation of area or a position of barycenter from the noise-removed image signal. According to such a configuration, the position determination section acts as an image processing operation unit calculating barycentric coordinates or area as positional information of an object based on an analog signal outputted from the photosensors 12B. Such operation processing of the position determination section is described later. The position determination section may have CPU (Central Processing Unit) in addition to such an image processing operation unit.

Next, operation and effects of the display device 1 are described.

Display Operation

Figure 6:
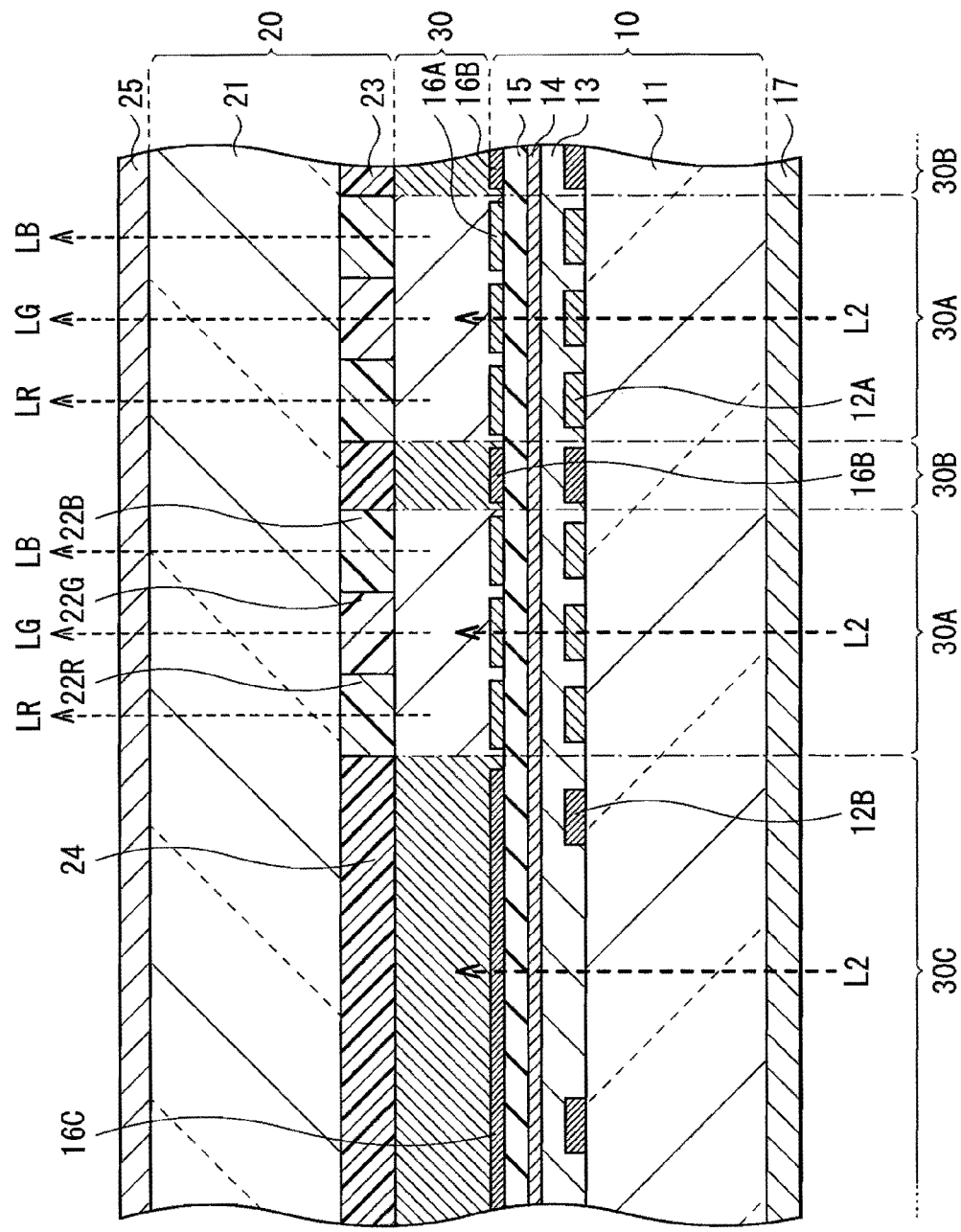
FIG. 6 is a schematic view for illustrating image display operation based on visible light.
Figure 7B:
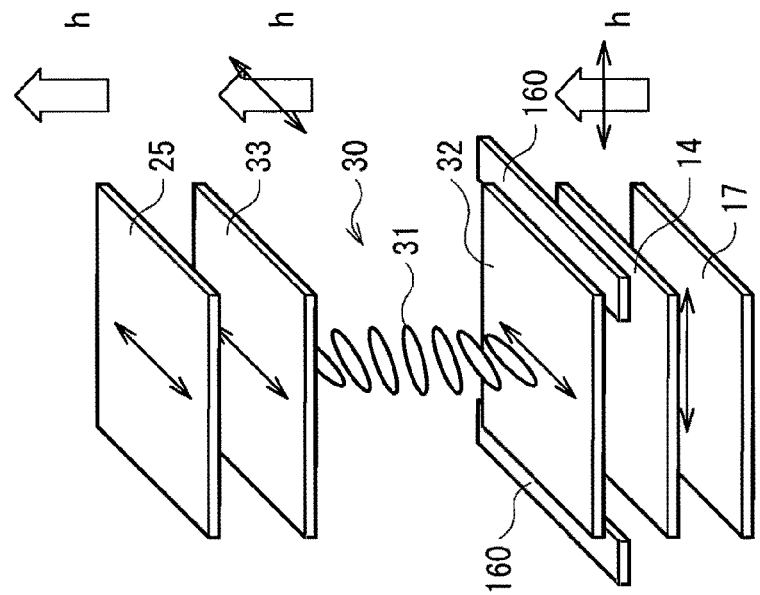
FIGS. 7A and 7B are schematic views for illustrating a display operation principle in an FFS mode.
Figure 7A:
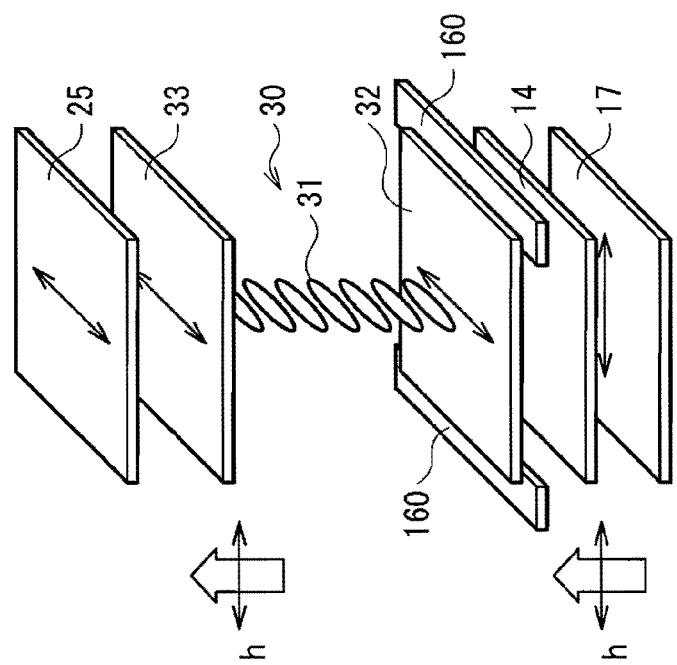
Figure 8A:
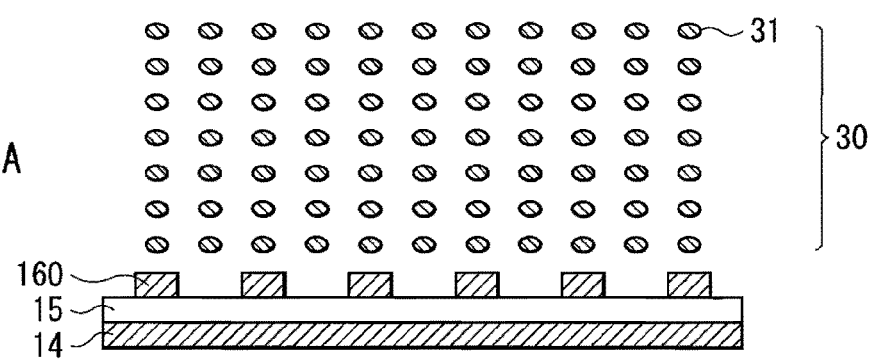
FIGS. 8A and 8B are views showing a relevant section of a liquid crystal element in an enlarged manner.
Figure 8B:
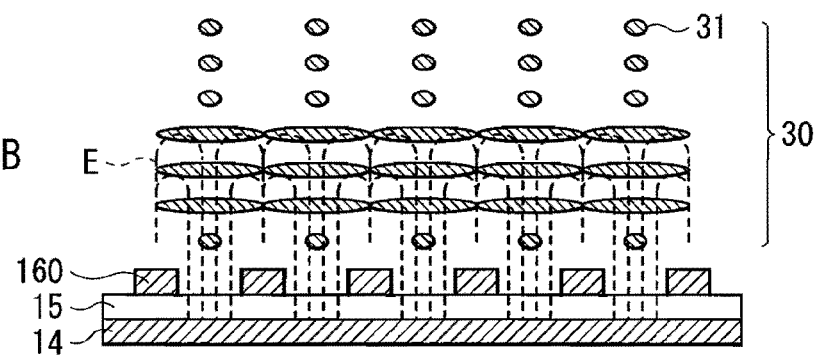

First, display operation of the display device 1 is described with reference to FIGS. 6 to 8. FIG. 6 is a schematic view for illustrating image display using the visible light L2. FIGS. 7A and 7B are schematic views for illustrating a display operation principle in the FFS mode. FIGS. 8A and 8B are views showing a relevant section of a liquid crystal element in an enlarged manner. In FIGS. 7A to 8B, FIG. 7A or 8A shows a state of the liquid crystal element during applying no electric field, and FIG. 7B or 8B shows a state of the liquid crystal element during applying an electric field.

In the display device 1, when a drive voltage of a predetermined threshold voltage or more is supplied between the common electrode 14 and the pixel electrodes 16A based on an image signal in the effective display area B, the liquid crystal layer 30 is applied with a predetermined electric field so that a liquid crystal state is modulated. Thus, the visible light L2, which enters the liquid crystal layer 30 from a side of the backlight 40 via the polarizing plate 17, is modulated for each display pixel, and then ejected from a top of the polarizing plate 25 as three-color display light LR, LG and LB through corresponding color filter layers 22R, 22G and 22B. In contrast, in the frame area A, the visible light L2 entering from the backlight 40 side is shielded by the invisible-light transmissive black 24. In this way, image display is performed in the image display area 30A of the effective display area B.

Moreover, light, which is emitted from the backlight 40 and enters the invisible-light transmissive blacks 23 and 24, are shielded by the invisible-light transmissive blacks 23 and 24, therefore the light is prevented from adversely affecting optical characteristics of the display light LR, LG and LB.

Here, the display operation principle in the FFS mode is described in detail with reference to FIGS. 7A and 7B. In FIGS. 7A and 7B, an alignment film 32 is formed covering the pixel electrodes 16A including a plurality of sub pixel electrodes 160, and an alignment film 33 is formed also on a side of the substrate 21 (not shown in FIGS. 7A and 7B) of the CF substrate 20. In addition, FIGS. 7A and 7B show a case where a rubbing direction of each of the two alignment films 32 and 33 corresponds to a transmission axis of the polarizing plate 25 on a light outgoing side.

In a state where voltage is not applied between the common electrode 14 and the pixel electrodes 16A (FIG. 7A and FIG. 8A), axes of liquid crystal molecules 31 configuring the liquid crystal layer 30 are perpendicular to a transmission axis of the polarizing plate 17 on an incidence side, and parallel to the transmission axis of the polarizing plate 25 on the light outgoing side. Thus, incident light transmitted by the polarizing plate 17 on the incidence side reaches the polarizing plate 25 on the light outgoing side without causing phase difference in the liquid crystal layer 30, and absorbed by the polarizing plate 25, leading to black display. In contrast, in a state where voltage is applied between the common electrode 14 and the pixel electrodes 16A (FIG. 7B and FIG. 8B), an alignment direction of the liquid crystal molecules 31 is rotated in an oblique direction with respect to an extending direction of each pixel electrode 16A by a transverse electric field E produced between the sub pixel electrodes 160. At that time, electric field intensity in white display is optimized such that liquid crystal molecules 31 located in the center in a thickness direction of the liquid crystal layer 30 are rotated by about 45 degrees. Thus, phase difference occurs in incident light h, which has been transmitted by the polarizing plate 17 on the incidence side, during passing through the liquid crystal layer 30, causing linearly polarized light rotated at 90 degrees, and the linearly polarized light passes through the polarizing plate 25 on the light outgoing side, leading to white display.

In contrast, when a drive voltage of a predetermined threshold voltage or more is supplied between the common electrode 14 and the black display electrode 16B, and between the common electrode 14 and the black display electrode 16C in the black display area 30B of the effective display area B and the black display area 30C of the frame area A, respectively, the liquid crystal layer 30 is applied with a predetermined electric field so that a liquid crystal state is modulated. Electric potential provided to each of the common electrode 14 and the black display electrode 16B or 16C is controlled so that the liquid crystal layer 30 is controlled to continuously perform black display.

Input Operation

Figure 9:
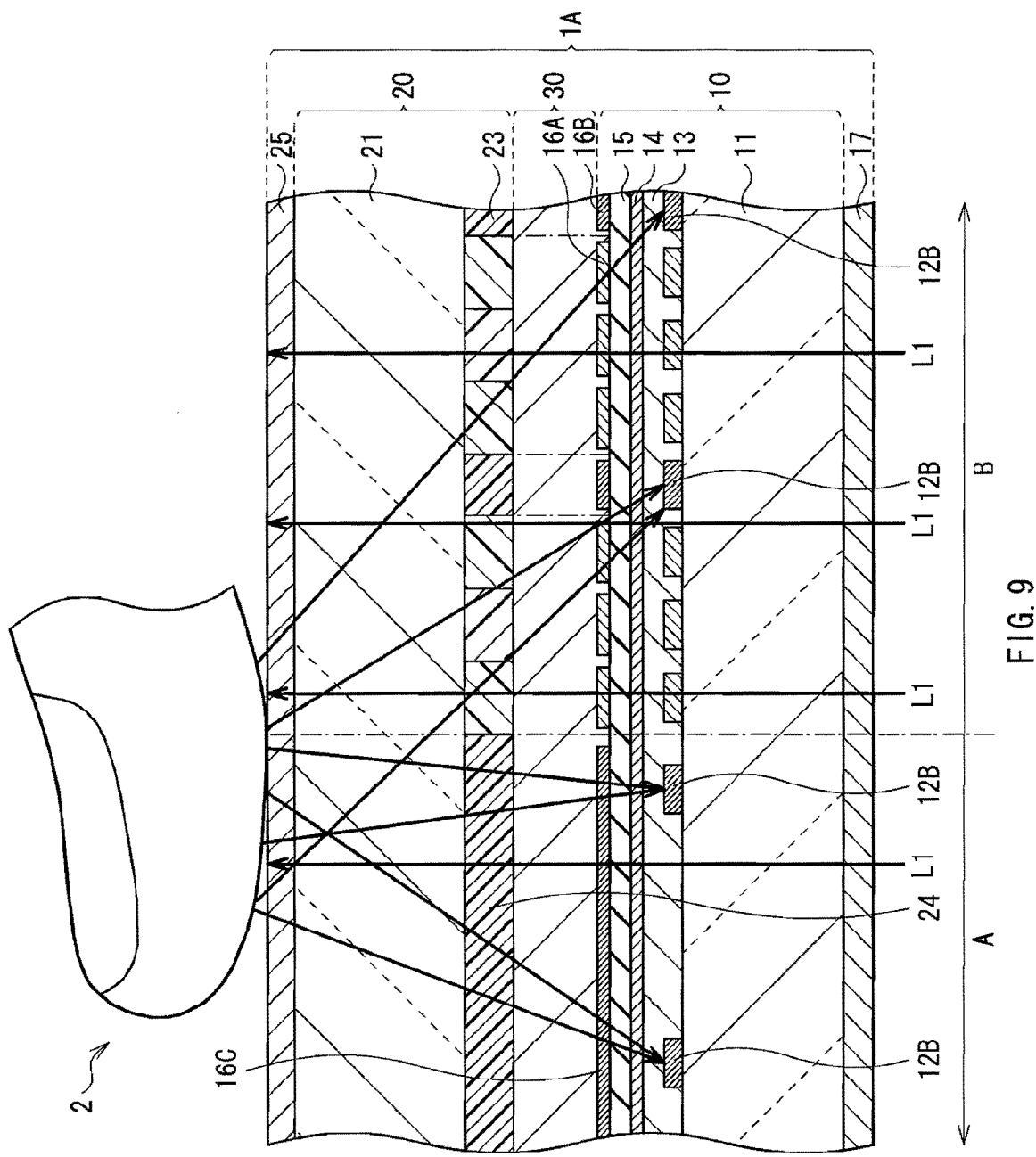
FIG. 9 is a schematic view for illustrating a state of receiving invisible light.
Figure 10A:
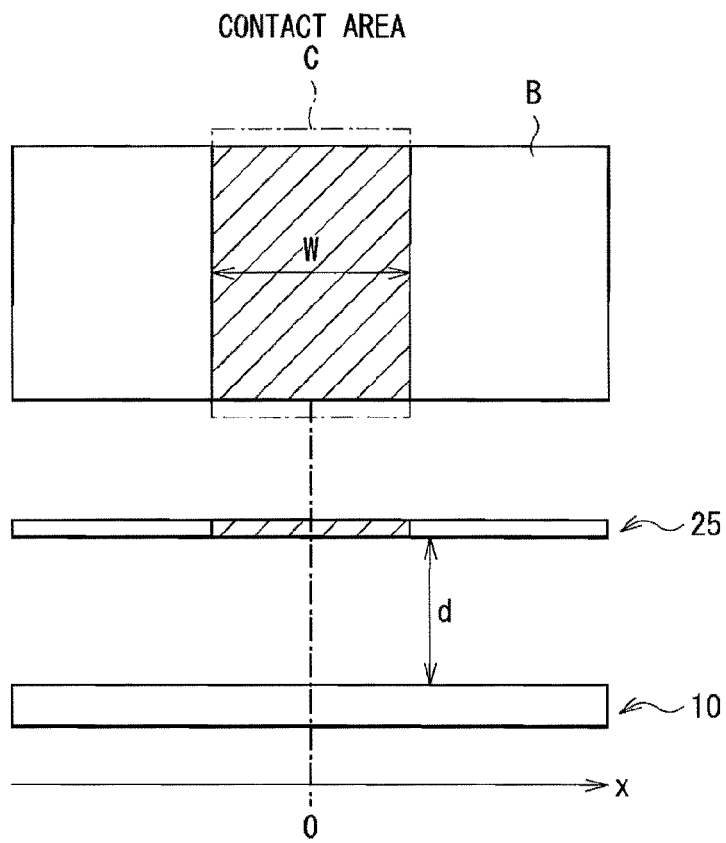
FIGS. 10A and 10B are views showing a simulation result on detected intensity distribution with respect to contact area of a reflecting plate.
Figure 10B:
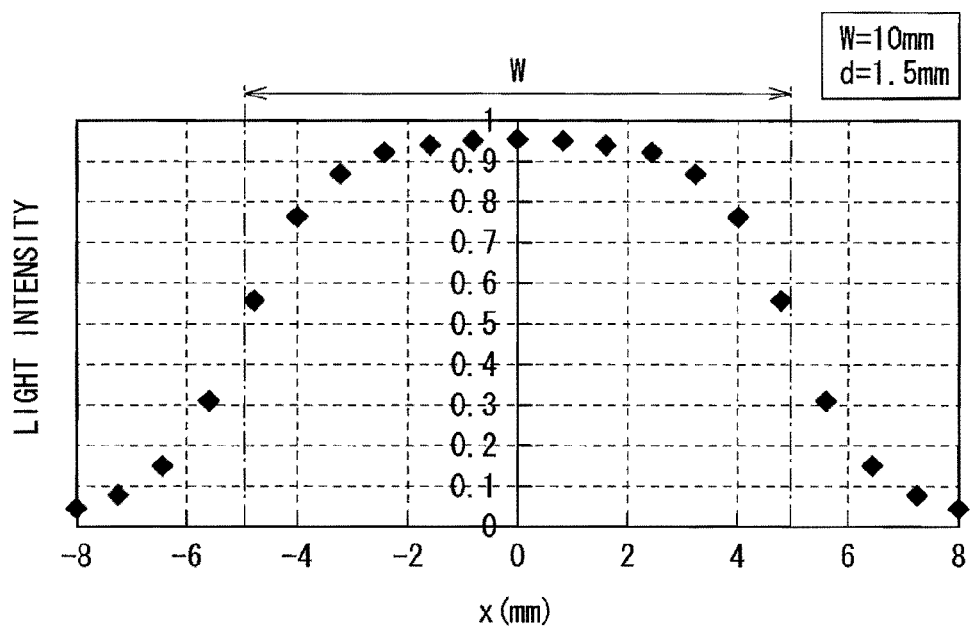

Next, input operation of the display device 1 is described with reference to FIG. 9 to FIG. 13B. FIG. 9 is a schematic view for illustrating a state of receiving the invisible light L1. FIGS. 10A and 10B show a simulation result on detected intensity distribution with respect to a contact area of an object.

As described before, while an image is displayed in the effective display area B based on the visible light L2 emitted from the backlight 40, the invisible light L1 from the backlight 40 is sequentially transmitted by the polarizing plate 17, the TFT substrate 10, the liquid crystal layer 30, the CF substrate 20, and the polarizing plate 25. At that time, the invisible light L1 passes therethrough without being shielded by the liquid crystal layer 30, the color filter layer 22, and the invisible-light transmissive blacks 23 and 24. For example, when a finger 2 is placed on (contacted to) a top of the display panel 1A (top of the polarizing plate 25), the invisible light L1 ejected from a top of the polarizing plate 25 is reflected and diffused from a surface of the finger 2. Such reflected light is received by the photosensors 12B arranged on the TFT substrate 10, thereby information on light intensity distribution of the finger 2 is obtained. When the information on light intensity distribution is outputted to the position determination section, the position determination section calculates barycentric coordinates of the finger 2, and thus determines a position of the finger 2.

A relationship between a contact position of the finger 2 and light intensity distribution is described. First, a case where the finger 2 is contacted to a portion near the center of the effective display area B is described with reference to FIGS. 10A and 10B. As shown in FIG. 10A, a contact area C is assumed as an area of width W in the effective display area B, and a distance between the polarizing plate 25 to be a contact surface and the TFT substrate 10 having the photosensors 12B is assumed as d. In such a case, for example, when W=10 mm and d=1.5 mm are assumed, intensity distribution as shown in FIG. 10B is given. However, a width direction of the contact area C is assumed as x direction, and a central position of width W is assumed as x=0. It can be seen therefrom that intensity distribution extends over a wide range compared with the actual contact area C with width W=10 mm. This is because after the invisible light L1 is reflected and diffused from a surface of the finger 2, the invisible light L1 spreads before the light reaches the photosensors 12B.

Figure 12A:
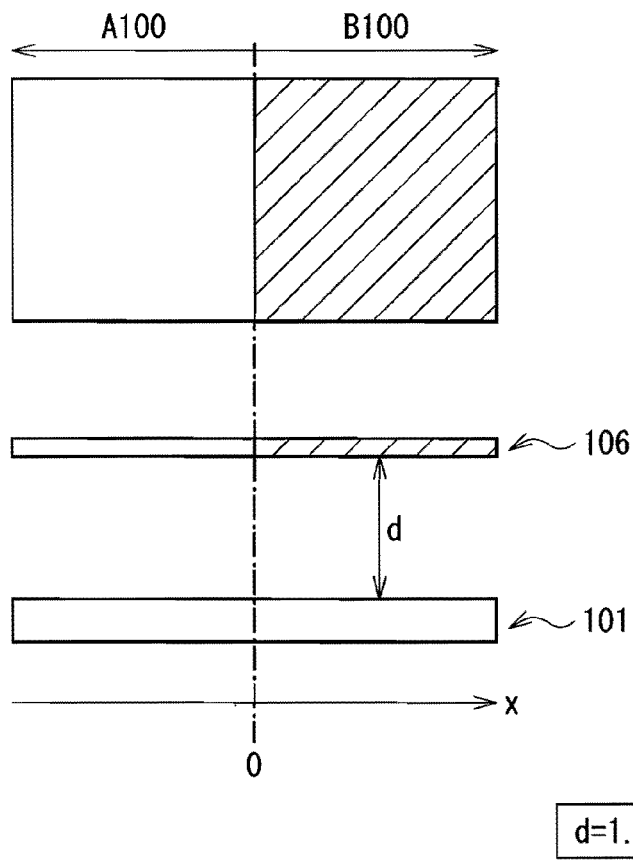
FIGS. 12A and 12B are views showing a simulation result on intensity distribution in a portion near a frame area of the display device shown in FIGS. 11A and 11B.
Figure 12B:
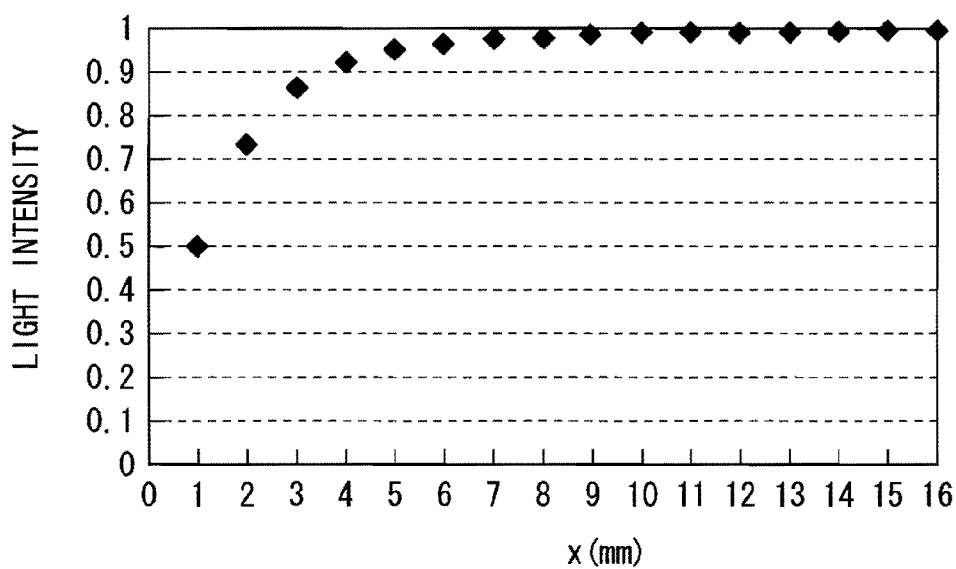

On the other hand, a case where the finger 2 is contacted to a region of the effective display area B near the frame area A is described in comparison to a comparative example. FIGS. 11A and 11B show a schematic configuration of a display device 100 performing position detection by using invisible light. FIG. 11A shows a general configuration of the display device 100 as viewed from a top, and FIG. 11B is a section view in an arrow direction along a line II-II of FIG. 11A. FIGS. 12A and 12B show a simulation result on light intensity distribution in a region near the frame area in the display device of the comparative example shown in FIGS. 11A and 11B.

The display device 100 has a display screen having an effective display area B100 as an image display area, and a frame area A100 surrounding the effective display area. The display device 100 is connected to an external device at an end of the display device in a region 120 where a wiring layer is partially exposed. The display device 100 includes a liquid crystal layer 103 enclosed between a TFT substrate 101 in which TFT 1012A and photosensors 1012B detecting invisible light are disposed on a substrate 1011, and a CF substrate 102 on which a color filter layer 1022 is formed. A backlight 104 irradiating visible light and invisible light to a side of the liquid crystal layer 103 is provided below the liquid crystal layer 103. A shielding layer 1024 for shielding light is formed in the frame area A100. According to such a configuration, while image display is performed based on the visible light, a position is determined based on intensity distribution of invisible light detected from the photosensors 1012B.

The display device 100 according to such a comparative example was subjected to simulation on photo-detection in a region near the frame area A100. Assuming that a reflecting plate as a detection object was contacted to a top of a polarizing plate 106, photo-detection was simulatively performed. In FIG. 12A, a distance between the polarizing plate 106 to be a contact surface and the TFT substrate 101 having the photosensor 1012B was assumed as d, and a boundary between the frame area A100 and the effective display area B100 was assumed as x=0. As a result, intensity distribution was given as shown in FIG. 12B. While each photosensor 1012B detects light reflected and diffused from a surface of the reflecting plate (hereinafter, called diffused light), a certain distance exists between the photosensor 1012B and the reflecting plate. Therefore, the diffused light was incident on a photosensor 1012B near x=0 not only from a side of the effective display area B100 but also a side of the frame area A100. However, in the comparative example, since the shielding layer 1024 shielding invisible light was provided in the frame area A100, the diffused light was partially shielded in a region near x=0. In addition, since invisible light emitted from the backlight 104 was also shielded by the shielding layer 1024, the invisible light does not reach a top of the frame area A100. Therefore, the amount of detected light was reduced compared with actual amount near x=0, namely, in a region of the effective display area B100 near the boundary with the frame area A100. In this way, when the invisible light for detection was shielded in the frame area A100, photo-detection intensity was reduced in the region of the effective display area B100 near the boundary with the frame area A100, and therefore photo-detection accuracy was not sufficiently ensured in the region near the boundary.

Figure 13A:
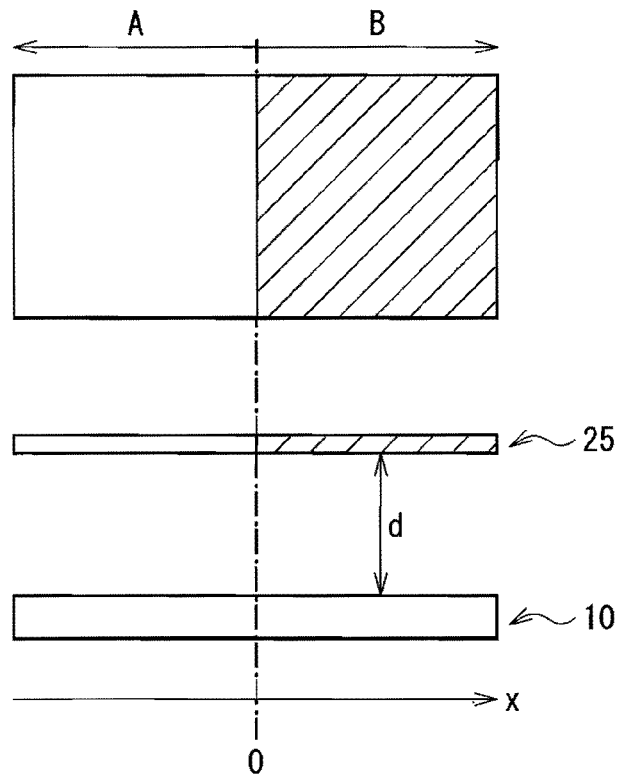
FIGS. 13A and 13B are views showing a simulation result on light intensity distribution in a portion near a frame area A.
Figure 13B:
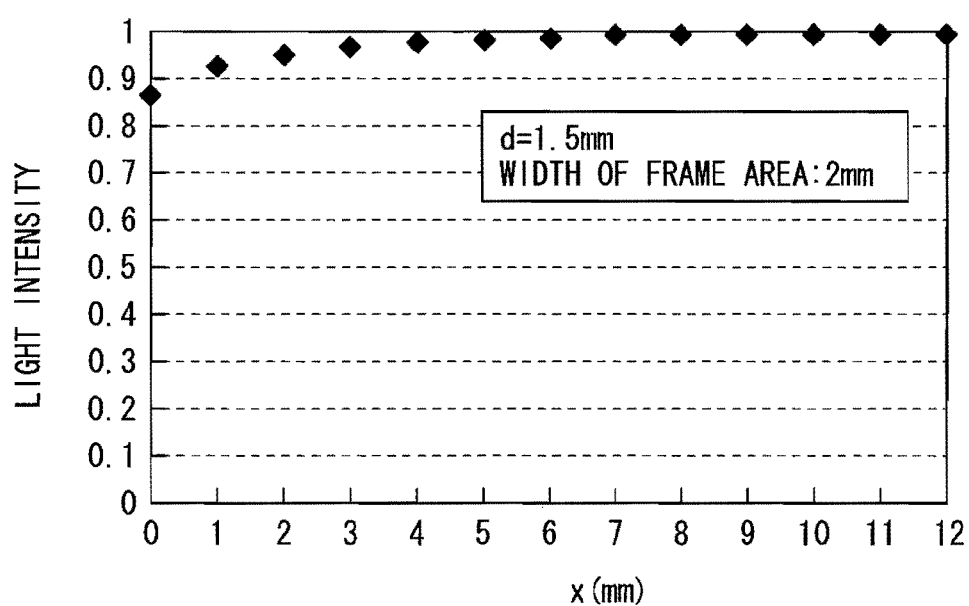

On the other hand, in the present embodiment, the invisible-light transmissive black 24 provided in the frame area A shields visible light, and transmits invisible light. Thus, the invisible light L1 from the backlight 40 may reach a top of the frame area A, and the invisible light L1 reflected on a surface of the finger 2 is hardly shielded by the invisible-light transmissive black 24. The display device 1 of the present embodiment was subjected to simulation on photo-detection in a region near the frame area A. FIGS. 13A and 13B show a simulation result of light intensity distribution in the region near the frame area A of the present embodiment. Assuming that a reflecting plate as a detection object was contacted to a top of a polarizing plate 25, photo-detection was simulatively performed. A distance between the polarizing plate 25 to be a contact surface and the TFT substrate 10 having the photosensors 12B was assumed as d, a boundary between the frame area A and the effective display area B was assumed as x=0, and width of an area, which may transmit the invisible light L1, in the frame area A was assumed as 2 mm. In such a case, intensity distribution is given as shown in FIG. 13B, in which reduction in photo-detection intensity is suppressed even in a region near x=0. This is because the invisible-light transmissive black 24 provided in the frame area A transmits invisible light, thereby even diffused light entering from a side of the frame area A may be used for detection by the photosensors 12B provided near x=0. This may suppress reduction in photo-detection intensity in the region near x=0, namely, in a region of the effective display area B near a boundary with the frame area A.

Figure 14:
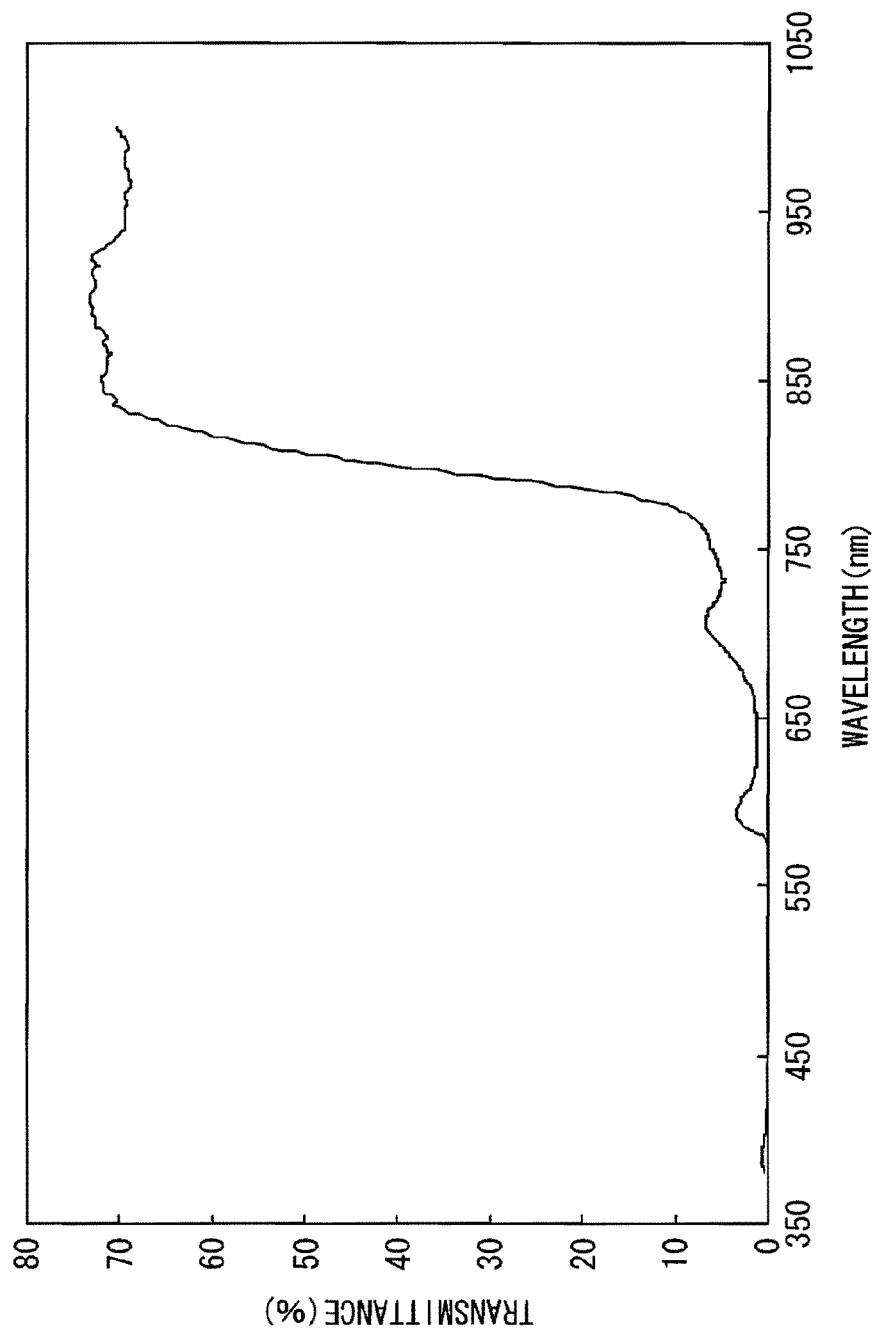
FIG. 14 is a characteristic diagram showing transmittance of an invisible-light transmissive black according to an example of the first embodiment.

FIG. 14 shows a result of measuring transmittance of each of the invisible-light transmissive blacks 23 and 24 being actually prepared. Near-infrared LED having an emission center wavelength of 850 nm was used as a light source emitting the invisible light L1. A pigment-dispersed resist, including an acrylic photoresist dispersed with copper phthalocyanine compounds (blue and green) and an azo-pigment (red) compound organic pigment, was used for the invisible-light transmissive black 23 or 24. As shown in FIG. 14, the invisible-light transmissive black 23 or 24 prepared in this way selectively transmits infrared light while slightly transmitting visible light.

Figure 15:
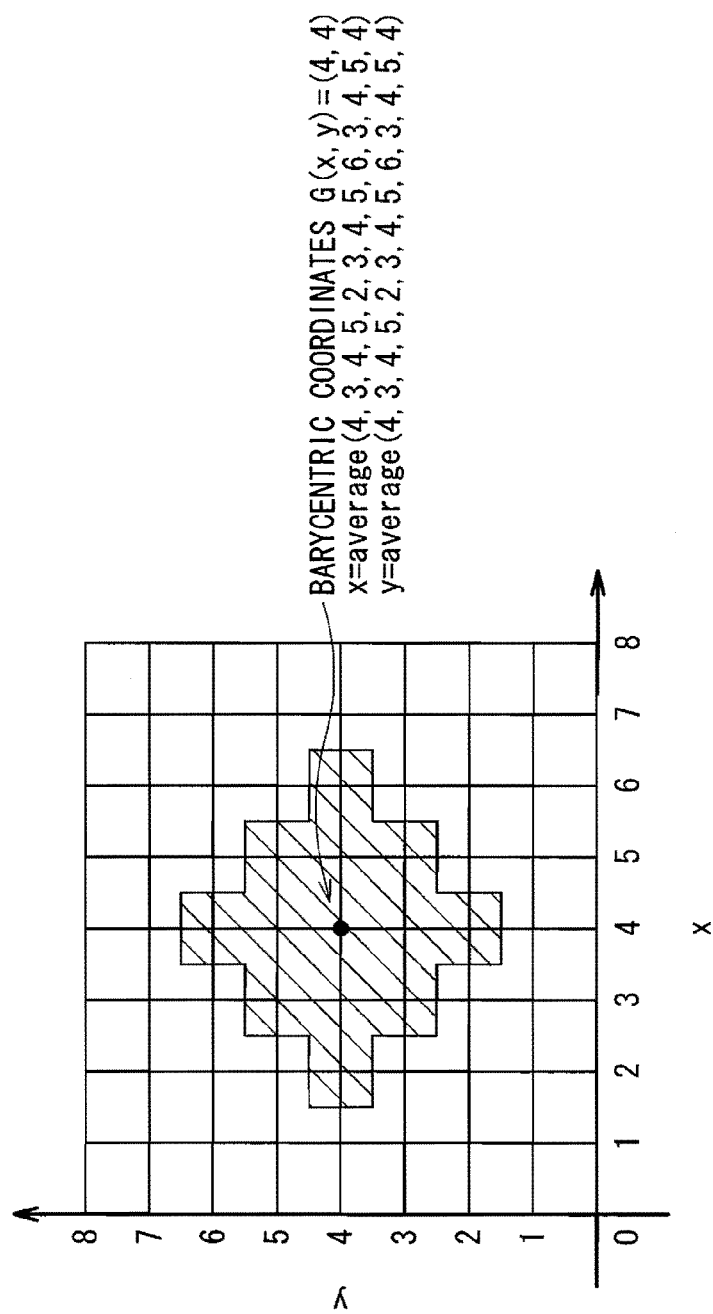
FIG. 15 is a conceptual diagram for illustrating calculation of barycentric coordinates by a position determination section.

When the photosensors 12B perform photo-detection in the above way, obtained information on intensity distribution is outputted to the position determination section. The position determination section calculates barycentric coordinates G of a finger based on output from the photosensors 12B. Specifically, an (analog) output signal from the photosensors 12B is subjected to AD conversion, then such a digitalized image signal is subjected to processing of removing outside light components, and then regions, each region having a value equal to or larger than a certain threshold value, are binarized as shown in FIG. 15. Noise is removed from the binarized image, then an average value of x values and an average value of y values of central coordinates are calculated, thereby the barycentric coordinates G of the finger 2 is calculated. For example, when an x coordinate group is (4, 3, 4, 5, 2, 3, 4, 5, 6, 3, 4, 5, 4), and a y coordinate group is (4, 3, 4, 5, 2, 3, 4, 5, 6, 3, 4, 5, 4), central coordinates of them are (x, y)=(4, 4) being the barycentric coordinates G. In this way, a position of the finger 2 is determined.

Alternatively, an average of signal intensity (AD values) over a predetermined interval may be obtained before binarization so as to calculate the barycentric coordinates G of the finger 2 from (Σ(coordinates)*(AD values))/(average of AD values).

Alternatively, the position determination section may calculate contact area of the finger 2 based on information on intensity distribution obtained by the photosensor 12B. For example, a photosensor 12B outputting a value equal to or larger than a predetermined threshold value or more is specified from obtained intensity distribution, thereby contact area may be obtained from number of the specified photosensors 12B, an interval between the photosensors, and the like. Information on the contact area calculated in this way may be used to determine whether a contacted object is a finger or a pen. In addition, the information may be used for such an application that when contact area extremely exceeds a predetermined reference value, it is determined that touch input is not performed by a finger or pen. This may prevent false input that may occur, for example, in the case that a body including the display device 1 is received in a pocket or a bag, or an ear is moved close to a display portion when the display device 1 is used for a mobile phone.

As hereinbefore, in the present embodiment, image display based on visible light may be performed by the liquid crystal element in the effective display area B. In contrast, since the invisible-light transmissive black 24, which shields visible light and transmits invisible light, is provided in the frame area A, reduction in photo-detection intensity may be suppressed in a region of the effective display area B near a boundary with the frame area A. Consequently, when the finger 2 is contacted to a portion near the frame area A, high photo-detection accuracy may be achieved. Moreover, high position determination accuracy may be thus ensured by the position determination section.

In addition, when the photosensor 12B detecting invisible light is provided not only in the effective display area B but also in the frame area A, invisible light reflected and diffused from a surface of the finger 2 may be detected not only in the effective display area B but also in the frame area A. Thus, shift in barycentric coordinates G may be suppressed in a region near the frame area A.

Furthermore, when the invisible-light transmissive blacks 23 having the same or similar characteristic as that of the invisible-light transmissive black 24 is provided as a so-called black matrix arranged with the color filter layer 22 of plural colors in the effective display area B, transmittance of invisible light may be increased. Thus, a current level of near-infrared LED may be decreased correspondingly to increase in transmittance of invisible light, leading to low power consumption.

In addition, when the liquid crystal layer 30 and the common electrode 14 are extended to areas (black display areas 30B and 30C) corresponding to the invisible-light transmissive black 24 in the frame area A and the invisible-light transmissive blacks 23 in the effective display area B, and the black display electrodes 16B and 16C are provided in the areas respectively, a black level may be improved, so that visible light may be more effectively shielded. That is, for example, even if a material used for the invisible-light transmissive blacks 23 and 24 slightly transmits visible light, light leakage due to such transmission may be suppressed. In other words, a range of material selection of the invisible-light transmissive blacks 23 and 24 is expanded. Moreover, since light leakage from the invisible-light transmissive black 23 is suppressed in the effective display area B, display contrast is improved.

Next, modifications (modifications 1 and 2) of the display panel of the display device 1 of the first embodiment are described. Hereinafter, the same or equivalent elements as in the first embodiment are marked with the same reference numerals or signs, and description of them is appropriately omitted.

Modification 1

Figure 16:
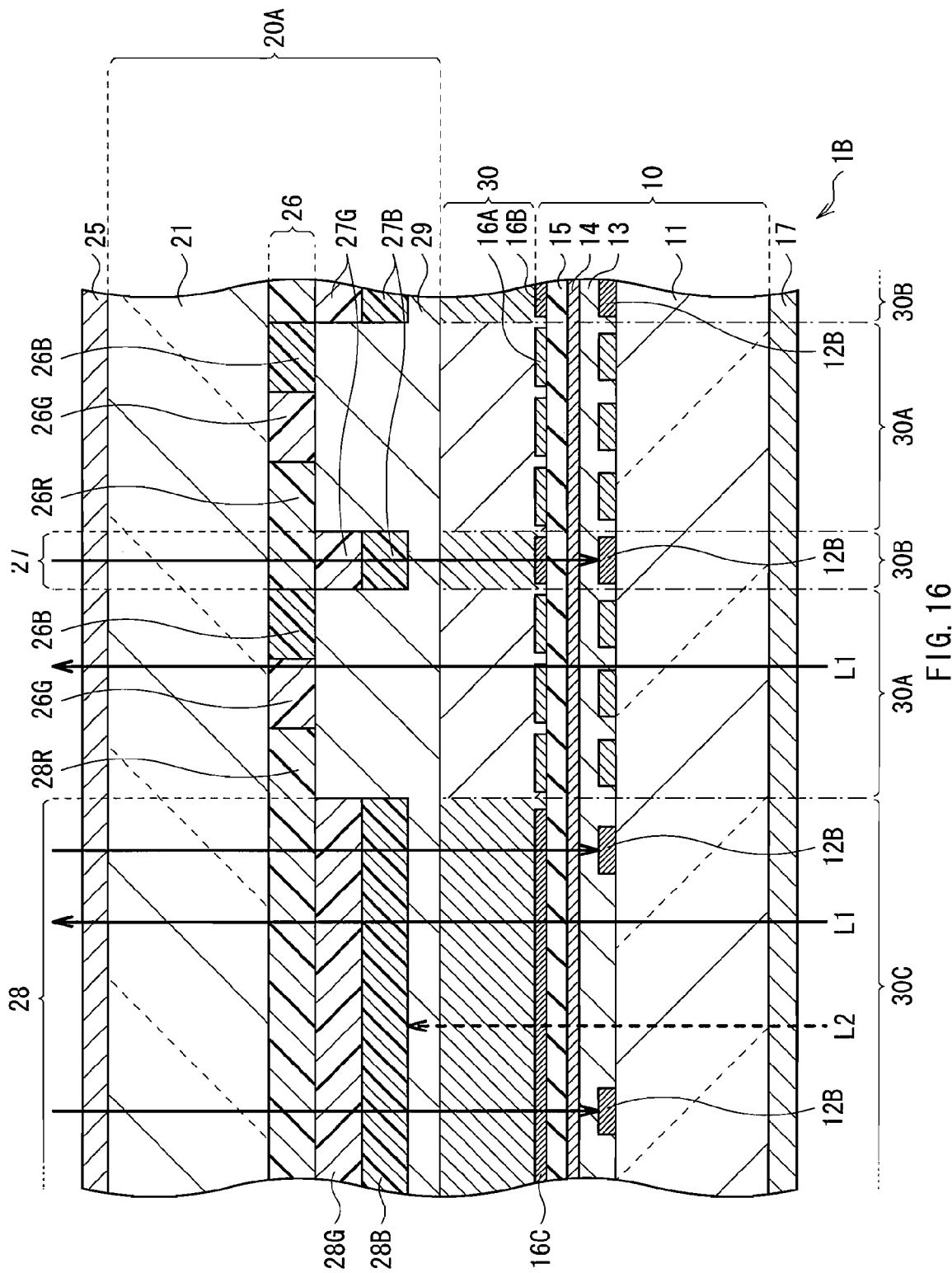
FIG. 16 is a section view of a region near a boundary between a frame area A and an effective display area B of a display device according to modification 1.

FIG. 16 is a section view of a region near a boundary between a frame area A and an effective display area B of a display panel 1B according to the modification 1. The modification has the same or similar configuration as that of the display device 1 of the first embodiment except for a configuration of a color filter layer, and a configuration of each of invisible-light transmissive blacks 27 and 28 in the frame area A and the effective display area B of the display panel 1B.

Each of the invisible-light transmissive blacks 27 and 28 is a shielding layer that shields visible light, and transmits invisible light, which is configured of a plurality of stacked color filters which are different in color from one another. The invisible-light transmissive black 27 provided in the effective display area B is formed by stacking a red color filter layer 26R, a green color filter layer 27G, and a blue color filter layer 27B in order from a side of a substrate 21. The color filter layer 26R is extended to an image display area 30A, and such an extended area forms a color filter layer for image display in conjunction with a green color filter layer 26G and a blue color filter layer 26B. Similarly, the invisible-light transmissive black 28 provided in the frame area A is formed by stacking a red color filter layer 28R, a green color filter layer 28G, and a blue color filter layer 28B in order from the substrate 21 side. The color filter layer 28R is extended to the image display area 30A, and such an extended area forms a color filter layer for image display in conjunction with the green color filter layer 26G and the blue color filter layer 26B. The invisible-light transmissive blacks 27 and 28, and the color filter layers for image display may be formed using the same or similar material and the same or similar process.

Such a stacked structure of the invisible-light transmissive black 27 or 28 causes a difference in level on one surface side of a CF substrate 20. Therefore, a planarization layer 29 is formed to avoid influence of the difference in level on image display.

In the present modification, visible light L2 from a backlight 40 (not shown in FIG. 16) is used for image display in the effective display area B, and shielded in areas corresponding to the invisible-light transmissive blacks 27 and 28. In particular, the visible light L2 entering the invisible-light transmissive black 27 passes through the color filter layer 27B, the color filter layer 27G and the color filter layer 26R in this order, and complementary color components of the respective colors of the light are absorbed during such passing. The same is true for the invisible-light transmissive black 28. Therefore, the same or equivalent advantage as in the first embodiment may be obtained. In addition, even in the present modification, black display areas 30B and 30C for continuous black display are formed, thereby leakage of visible light may be further suppressed, leading to improvement in black level. Here, even in the present modification, while both the common electrode and the black display electrode may be provided in the black display area 30B or 30C, only one of the electrodes may be provided therein.

Figure 17:
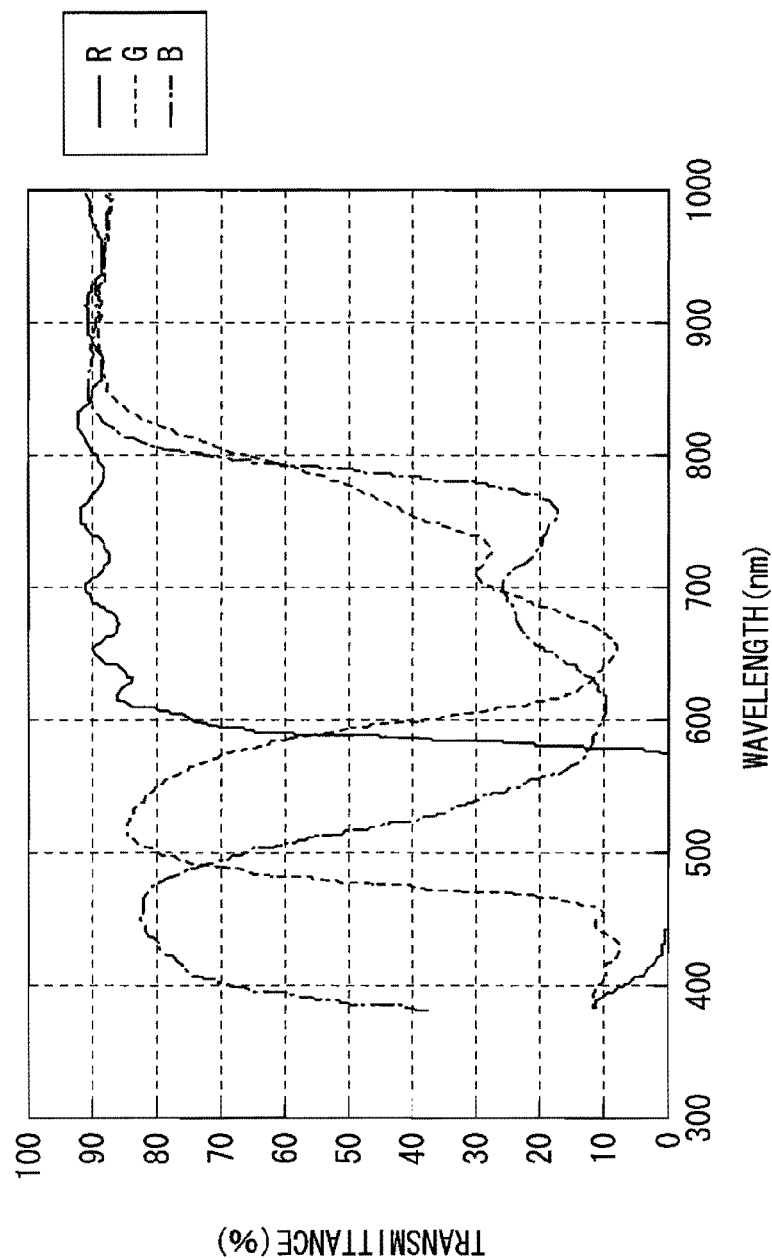
FIG. 17 is a characteristic diagram showing transmittance of an invisible-light transmissive black according to an example of the modification 1.

FIG. 17 shows measurement results of transmittance of red, green and blue filters as elements of the invisible-light transmissive black 27 or 28. Near-infrared LED having an emission center wavelength of 850 nm was used as a light source emitting the invisible light L1. A pigment-dispersed resist including an azo pigment dispersed in an acrylic resist was used as the red filter, a pigment-dispersed resist including a chlorinated phthalocyanine pigment dispersed in an acrylic resist was used as the green filter, and a pigment-dispersed resist including a phthalocyanine pigment dispersed in an acrylic resist was used as the blue filter. As shown in FIG. 17, the red, green and blue filters absorb colors being complementary colors of the respective colors, and transmit light in a near-infrared region of 800 nm or more. In the present modification, the invisible-light transmissive blacks 27 and 28 are achieved by stacking the color filters of three colors R, G and B. However, all the three colors may not be necessarily prepared, and a structure where color filters of two of the three colors are stacked may be used.

Modification 2

Figure 18:
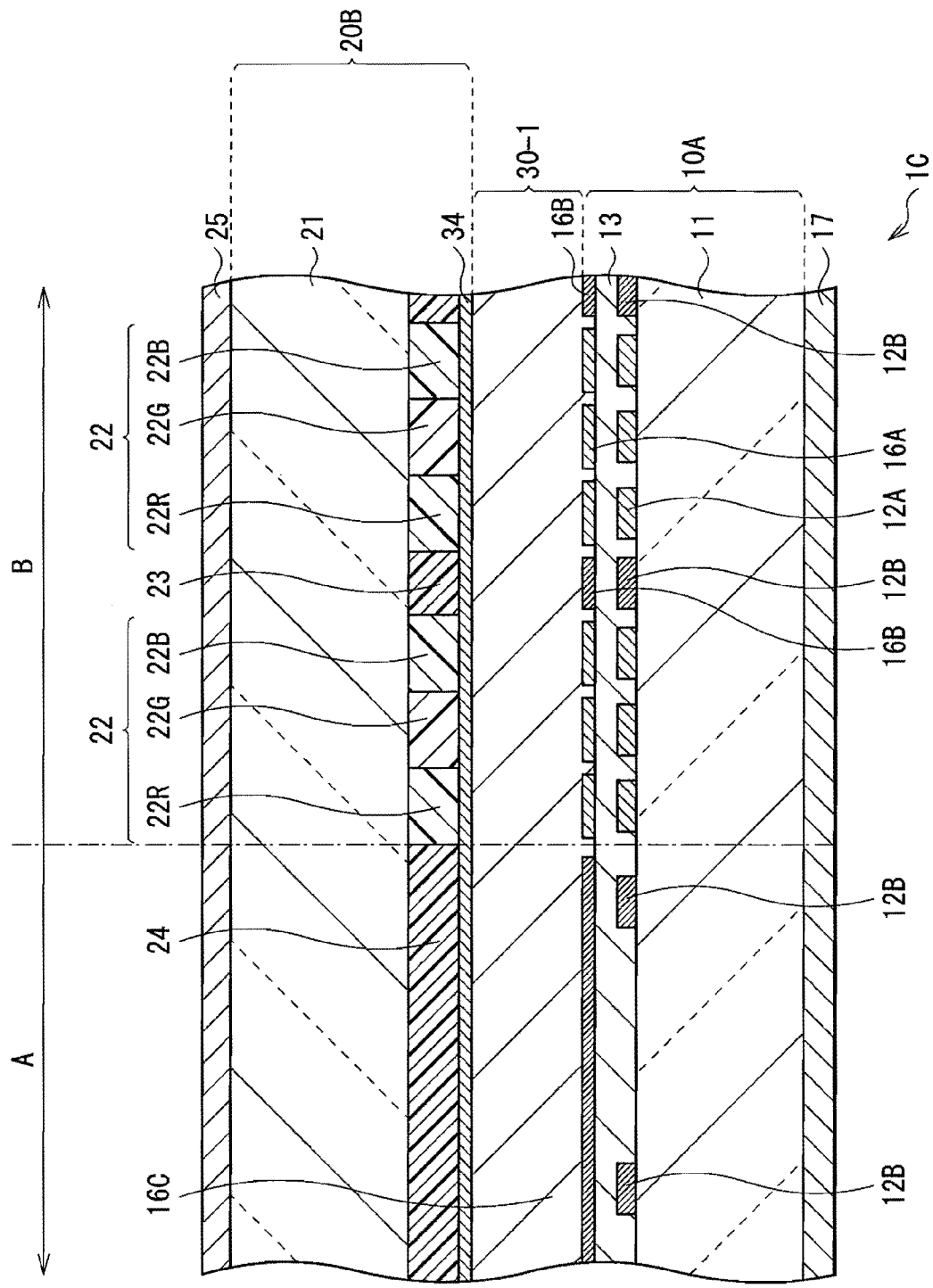
FIG. 18 is a section view of a region near a boundary between a frame area A and an effective display area B of a display device according to modification 2.

FIG. 18 is a section view of a region near a boundary between a frame area A and an effective display area B of a display panel 1C according to the modification 2. The modification has the same or equivalent configuration as that of the display device 1 of the first embodiment except that a common electrode 34 is provided on a color filter layer side of a CF substrate 20B, so that a drive mode of a liquid crystal element is different. That is, in the present modification, a TFT substrate 10A is configured such that pixel electrodes 16A and black display electrodes 16B and 16C are provided on a planarization layer 13 on a substrate 11, and the electrodes are opposed to the common electrode 34 via a liquid crystal layer 30-1. In such a configuration, various modes such as a TN (Twisted Nematic) mode, a VA (Vertical Alignment) mode, and an ECB (Electric-filed Control Birefringence) mode are used for the liquid crystal layer 30-1. In the present modification, when black display is performed in a black display area, the black display electrodes 16B and 16C are provided.

In this way, not only the transverse electric field mode such as FFS mode, but also various drive modes may be used for a liquid crystal element for image display. Even in the case of such a configuration, the same or equivalent advantage as in the first embodiment may be obtained.

Second Embodiment

Figure 19:
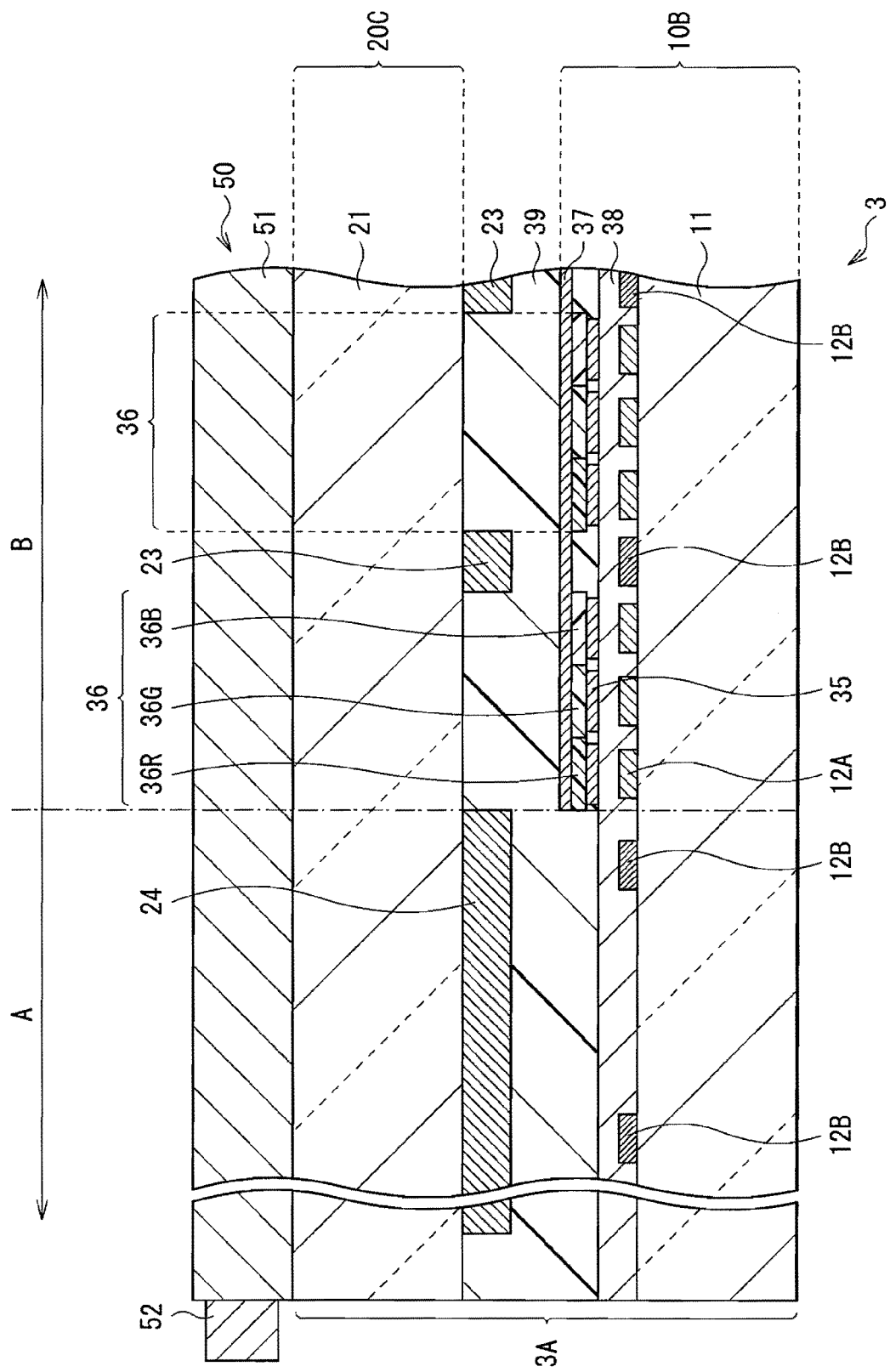
FIG. 19 is a section view of a region near a boundary between a frame area A and an effective display area B of a display device according to a second embodiment of the invention.

FIG. 19 is a section view of a region near a boundary between a frame area A and an effective display area B of a display device 3 according to a second embodiment. The same or equivalent elements as those of the display device 1 of the first embodiment are marked with the same reference numerals or signs, and description of them is appropriately omitted.

In the present embodiment, for example, an organic EL element exhibiting electroluminescence of three primary colors R, G and B is used as an image display element (display pixel) in the effective display area B. The display device 3 has a display panel 3A in which organic EL elements of the respective colors formed on a drive substrate 10B are sealed by a seal substrate 20C via a seal layer 39, and a front light 50 on a display surface side as a light source supplying invisible light for position detection. Since each of the organic EL elements is a selfluminous element, a light source for image display is not particularly provided.

In a drive substrate 10, TFT 12A and photosensors 12B are arranged with certain pitches on a substrate 11 in the effective display area B respectively as in the first embodiment. The TFT 12A and photosensors 12B are planarized by a planarization layer 38, and a pixel electrode 35 as an anode is provided on the planarization layer 38 for each pixel. A light emitting layer 36R emitting red light, a light emitting layer 36G emitting green light, and a light emitting layer 36B emitting blue light are sequentially provided on the pixel electrodes 35 generally in a matrix pattern. A common electrode 37 is formed as a cathode common to the pixels on the light emitting layers 36R, 36G and 36B. A hole injection layer or a hole transport layer common to the pixels may be provided between the pixel electrodes 35 and the light emitting layers 36R, 36G and 36B. An electron injection layer or an electron transport layer common to the pixels may be provided between the common electrode 37 and the light emitting layers 36R, 36G and 36B. Furthermore, it may be configured that the pixel electrodes 35 act as a cathode, and the common electrode 37 acts as an anode.

The light emitting layer 36R includes a fluorescent or phosphorescent light-emitting material, wherein the layer is applied with an electric field, thereby part of holes injected from the pixel electrodes 35 are recombined with part of electrons injected from the common electrode 37 so that red light is generated. The light emitting layer 36G or 36B is similarly applied with an electric field so that green or blue light is generated due to recombination of electrons and holes.

For the light emitting layer 36R, for example, a mixture of 4, 4-bis (2, 2-diphenylvinylene) biphenyl (DPVBi) with 2, 6-bis[(4'-methoxydiphenylamino) styryl]-1,5-dicyanonphthalene (BSN) or the like is used. For the light emitting layer 36G, for example, a mixture of DPVBi with coumarin 6 is used. For the light emitting layer 36B, for example, a mixture of DPVBi with 4, 4'-bis[2-{4-(N,N-diphenylamino) phenyl}vinyl]biphenyl (DPAVBi) or the like is used.

In contrast, the photosensors 12B are arranged with certain pitches on the substrate 11 in the frame area A as in the first embodiment.

The seal substrate 20C has an invisible-light transmissive black 24 in the frame area A and an invisible-light transmissive blacks 23 in the effective display area B on a surface of a substrate 21. While a color filter layer is not formed on the substrate 21 in the present embodiment, the color filter layer may be provided in correspondence to the organic EL element of the respective colors. Thus, outside light reflected on each layer or the like is absorbed, leading to improvement in contrast.

The front light 50 has, for example, an invisible light source 52 provided at an end of a light guide plate 51, wherein invisible light is emitted from the invisible light source 52, and propagated within the light guide plate, and then ejected above. For example, LED emitting infrared light is used as the invisible light source 52.

In the present embodiment, when a predetermined drive voltage is applied between the pixel electrodes 35 and the common electrode 37 in the effective display area B, the light emitting layers 36R, 36G and 36B emit light of respective colors, so that image display is performed. In contrast, when the front light 50 emits invisible light from a top, the invisible light is reflected and diffused from a surface of a finger 2 (not shown in FIG. 19) contacted to a top of the front light 50, and received by the photosensors 12B on the drive substrate 10B. Since the invisible-light transmissive black 24 transmitting invisible light is provided in the frame area A, reduction in photo-detection intensity may be suppressed in a region of the effective display area B near a boundary with the frame area A as in the first embodiment. Consequently, substantially the same advantage as in the first embodiment may be obtained.

Next, a modification (modification 3) of the display panel of the second embodiment is described. Hereinafter, the same or equivalent elements as in the second embodiment are marked with the same reference numerals or signs, and description of them is appropriately omitted.

Modification 3

Figure 20:
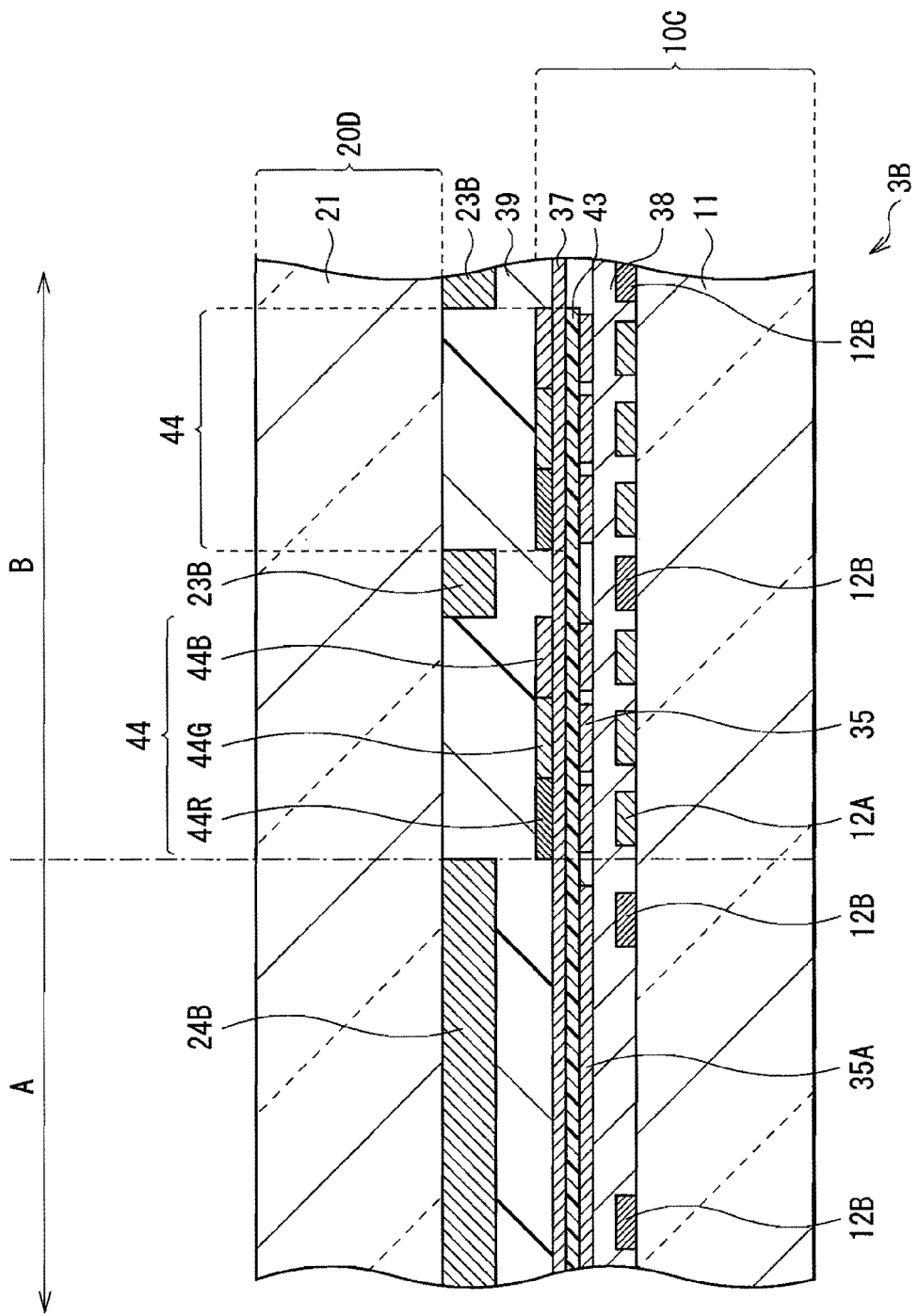
FIG. 20 is a section view of a region near a boundary between a frame area A and an effective display area B of a display device according to modification 3.

FIG. 20 is a section view of a region near a boundary between a frame area A and an effective display area B of a display panel 3B according to the modification 3. In the present modification, a light emitting layer generating invisible light is used as a light emitting layer exhibiting organic electroluminescence, and the invisible light is used to achieve both image display and position detection. Therefore, the front light 50 used in the second embodiment is not provided.

Specifically, a ultraviolet light emitting layer 43 emitting ultraviolet light is formed on each pixel electrode 35 as a common layer to pixel electrodes 35 in the effective display area B of a drive substrate 10C. A common electrode 37 and a color conversion layer 44 are sequentially formed on the ultraviolet light emitting layer 43. In the frame area A, an electrode 35A is provided on a planarization layer 38, and the ultraviolet light emitting layer 43 and the common electrode 37 are provided on the electrode 35A in a manner of extending from the effective display area B.

The ultraviolet light emitting layer 43 includes a fluorescent or phosphorescent light-emitting material, where the layer is applied with an electric field, thereby part of holes injected from the pixel electrodes 35 are recombined with part of electrons injected from the common electrode 37 so that ultraviolet light is generated. For example, a triazole derivative (TAZ) or the like is used as a material of the ultraviolet light emitting layer 43. In this case, the material is desirably combined with a wide-gap carrier transport material such as BCP, B-phen, and Bu-PBD. This is because such combination may prevent reduction in luminous efficiency and increase in light emitting wavelength due to energy transfer to a hole injection layer, a hole transport layer, an electron transport layer, and an electron injection layer (all layers are not shown), the layers being adjacent to the ultraviolet light emitting layer 43.

The color conversion layer 44 includes a color conversion layer 44R performing color conversion (energy conversion) of part of ultraviolet light emitted from the ultraviolet light emitting layer 43 into red light, a color conversion layer 44G performing color conversion of part of the ultraviolet light into green light, and a color conversion layer 44B performing color conversion of part of the ultraviolet light into blue light. The color conversion layer 44R includes, for example, the same or similar material as that of the light emitting layer 36R. The color conversion layer 44G includes, for example, the same or similar material as that of the light emitting layer 36G. The color conversion layer 44B includes, for example, the same or similar material as that of the light emitting layer 36B. Material or thickness of each of the color conversion layers 44R, 44G and 44B is appropriately selected depending on, for example, a ratio of necessary light of each color for image display to light of ultraviolet light for detection.

A seal substrate 20D has a ultraviolet-light transmissive black 24B in the frame area A, and a ultraviolet-light transmissive blacks 23B in part of the effective display area B on a surface of a substrate 21. Each of the ultraviolet-light transmissive blacks 23B and 24B shields visible light, and selectively transmits ultraviolet light.

In the present modification, in the effective display area B, when a predetermined drive voltage is applied between the pixel electrode 35 and the common electrode 37, the ultraviolet light emitting layer 43 emits ultraviolet light for each pixel. A part of the ultraviolet light passes through each of corresponding color conversion layers 44R, 44G and 44B, thereby such part of ultraviolet light is converted into each color light, and ejected from a top of the seal substrate 20D. Thus, image display is performed. In contrast, part of ultraviolet light emitted from the light emitting layer 43, the light being not subjected to color conversion by the color conversion layer 44, is directly ejected from the top of the seal substrate 20D. On the other hand, in the frame area A, when a predetermined drive voltage is applied between the electrode 35A and the common electrode 37, the ultraviolet light emitting layer 43 emits ultraviolet light, and the ultraviolet light travels up to a top of the frame area A through the ultraviolet-light transmissive black 24B. In this way, ultraviolet light is ejected from the frame area A and from the effective display area B, and the ejected ultraviolet light is reflected on a surface of a finger 2 (not shown in FIG. 20) contacted to the top of the seal substrate 20D, and received by the photosensors 12B on the drive substrate 10C. Since the ultraviolet-light transmissive black 24B transmitting ultraviolet light is provided in the frame area A as in the first embodiment, reduction in photo-detection intensity may be suppressed in a region of the effective display area B near a boundary with the frame area A. Consequently, substantially the same advantage as in the first and second embodiments may be obtained.

Third Embodiment

Figure 21:
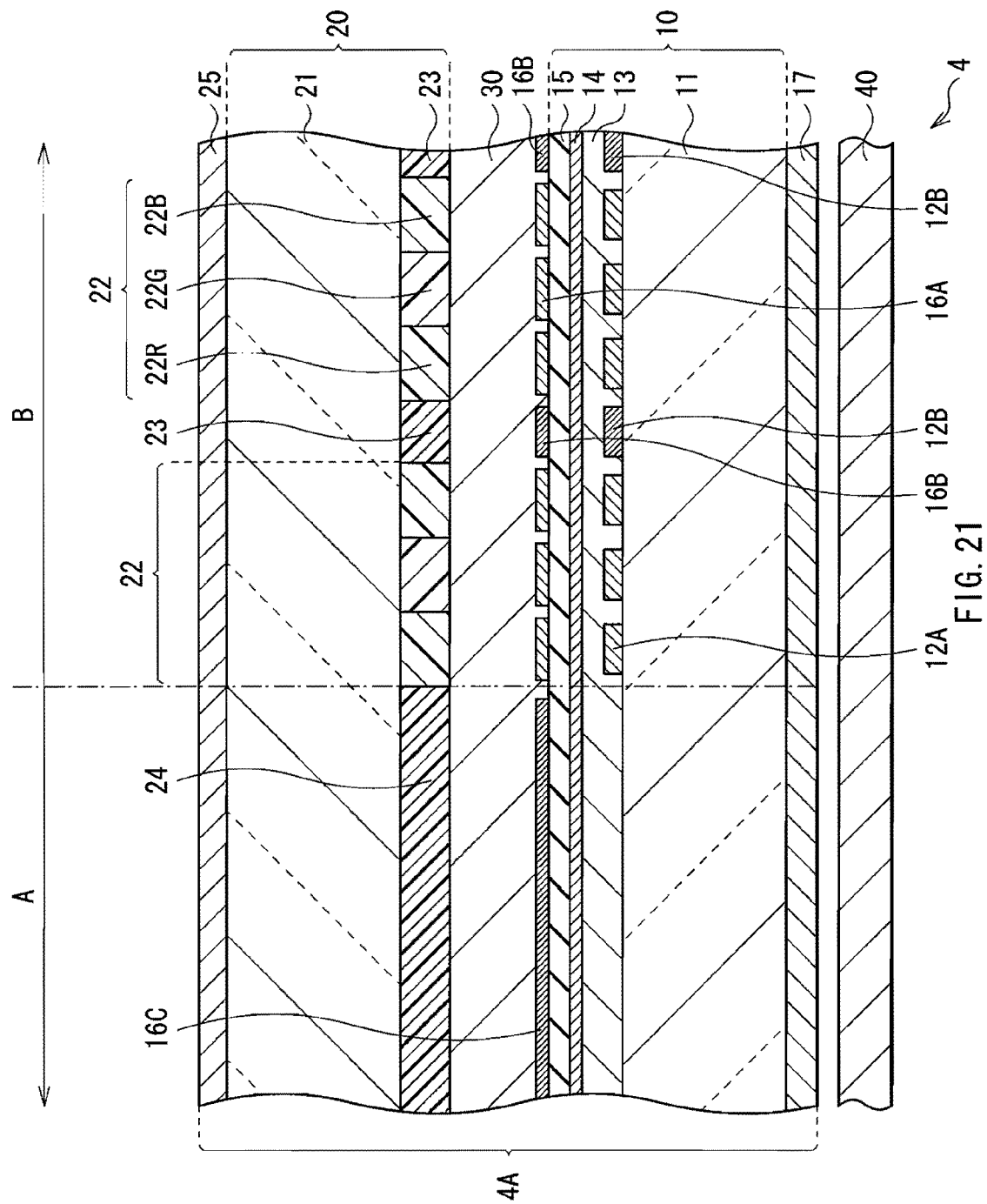
FIG. 21 is a section view of a region near a boundary between a frame area A and an effective display area B of a display device according to a third embodiment.
Figure 22:
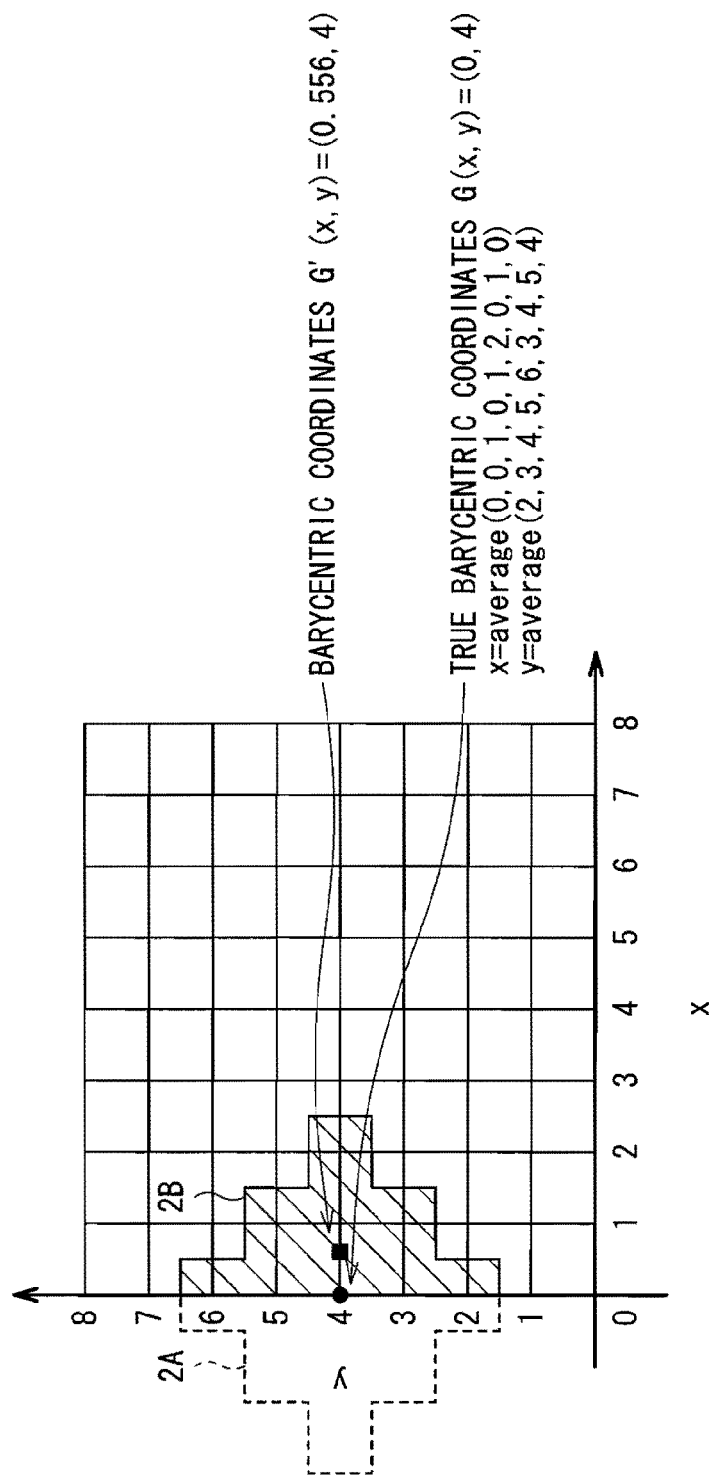
FIG. 22 is a conceptual diagram for illustrating detection of barycentric coordinates near a frame by a position determination section of the display device shown in FIG. 21.
Figure 23:
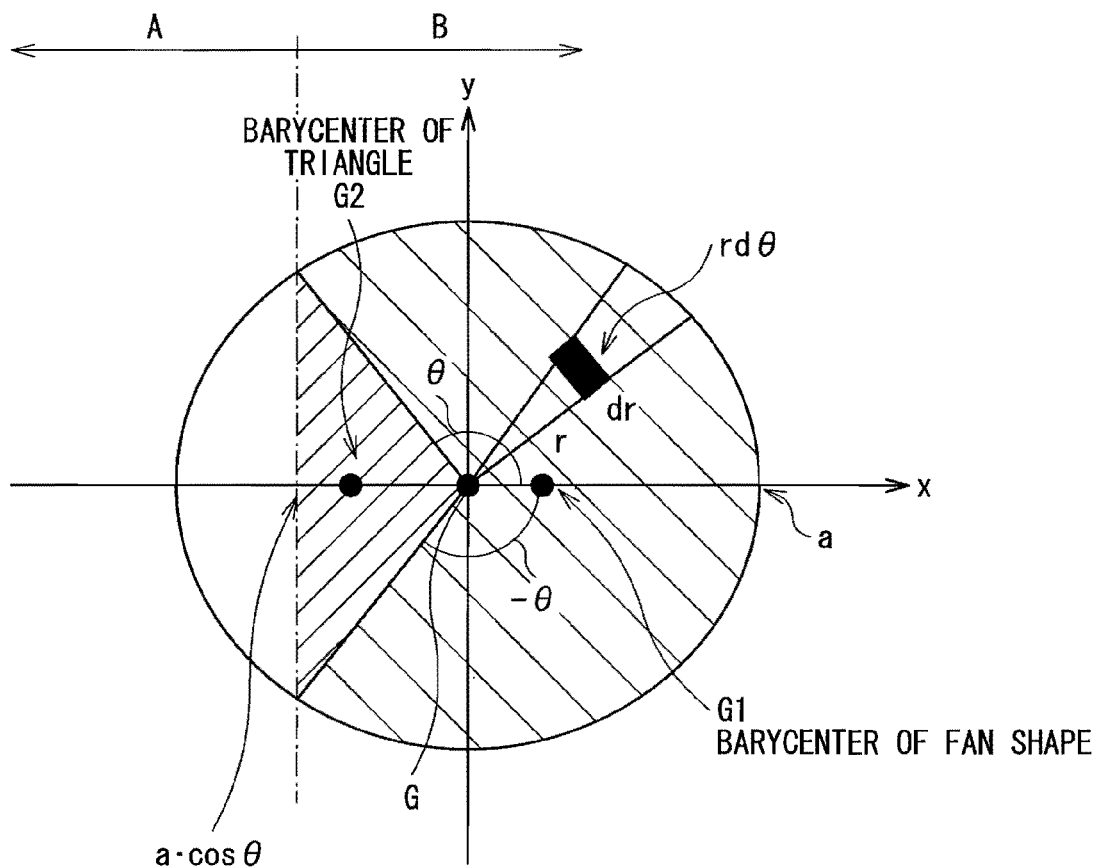
FIG. 23 is a schematic diagram for illustrating correction processing by the position determination section of the display device shown in FIG. 21.

FIG. 21 is a section view of a region near a boundary between a frame area A and an effective display area B of a display device 4 according to a third embodiment. FIGS. 22 and 23 are conceptual diagrams for illustrating correction processing of a position determination section of the display device 4. The present embodiment is different from the display device 1 of the first embodiment, in that a display panel 4A does not have a photosensor 12B in the frame area A, in other words, has photosensors 12B only in the effective display area B. In addition, a correction unit is provided for correcting position shift during position determination. The same or equivalent elements as those of the display device 1 of the first embodiment are marked with the same reference numerals or signs, and description of them is appropriately omitted.

In the present embodiment, image display is performed based on visible light by a liquid crystal element in the effective display area B. In addition, since an invisible-light transmissive black 24, which shields visible light and transmits invisible light, is provided in the frame area A, even if a finger is contacted to a portion near the frame area A, invisible light being reflected and diffused from a surface of the finger 2 is hardly shielded in the frame area A. Thus, reduction in photo-detection intensity may be suppressed in the region of the effective display area B near a boundary with the frame area A as in the first embodiment. However, the photosensor 12B is not provided in the frame area A in the present embodiment unlike the first and second embodiments. Therefore, a not-shown position determination section performs the following position determination processing in order to improve position determination accuracy in a region near the frame area A.

Position Determination Processing

Specifically, first, the barycentric coordinates G of the finger 2 are calculated in the same way as in the first embodiment. In the calculation, as shown in FIG. 22, signals (signals corresponding to an area 2A in FIG. 22) are lost in the frame area A, that is, in an area where the photosensor 12B does not exist. Therefore, actually calculated, barycentric coordinates G' (x', y') are shifted from the true barycentric coordinates G (x, y) determined by the area 2A and an area 2B. For example, when an x coordinate group includes (0, 0, 1, 0, 1, 2, 0, 1, 0), and a y coordinate group includes (2, 3, 4, 5, 6, 3, 4, 5, 4), barycentric coordinates G' (x', y')=(0.556, 4) are given in contrast to the true barycentric coordinates G (x, y)=(0, 4).

Thus, the following correction of shift in barycentric coordinates is performed. That is, as shown in FIG. 23, assuming that a shape of the finger 2 is circular or elliptical, barycentric coordinates G0 of a shape, which is partially lost by the frame area A, is obtained. Specifically, for a triangle formed by the true barycentric coordinates G and the frame area A, and a fan shape cut by the triangle, area and barycentric coordinates are each obtained. Area S1 and barycentric coordinates G1 of the fan shape are expressed, for example, by the following formulas (4) and (5) based on the formulas (1) to (3). Area S2 and barycentric coordinates G2 of the triangle are expressed, for example, by the following formulas (6) and (7). In contrast, since the barycentric coordinates G0 is defined by the following formula (8), the coordinates G0 is expressed by a formula (9) based on the formulas (4) to (8). In the formulas, "a" shows a radius in the case that a shape of the finger 2 is circular. When the shape of the finger 2 is elliptical, length of a major axis $2a$ and length of a minor axis $2b$ can be used.

Numerical Expression 1

$$dS = dr \cdot rd\theta = rdrd\theta \quad (1)$$

$$x = r\cos\theta$$

$$x_G = \frac{\int x\sigma dS}{\int \sigma dS} \quad (2)$$

$$= \frac{\sigma \int r\cos\theta \cdot rdrd\theta}{\sigma \int rdrd\theta}$$

$$= \frac{\int_0^a r^2 dr \int_{-\phi}^{\phi} \cos\theta \cdot d\theta}{\int_0^a rdr \int_{-\phi}^{\phi} d\theta}$$

$$G1 = \frac{\frac{a^3}{3} \cdot 2\sin\phi}{\frac{a^3}{2} \cdot 2\phi} = \frac{2a}{3}\frac{\sin\phi}{\phi} \quad (3)$$

Numeral Expression 2

$$S1 = a^2\phi \quad (4)$$

$$G1 = (2/3)a(\sin\phi/\phi) \quad (5)$$

$$S2 = a^2 \cos\phi \sin\phi \quad (6)$$

$$G2 = (2/3)a \cos\phi \tag{7}$$

Barycentric coordinates G0 of circle partially lost by
frame=((barycenter of triangle*area thereof)+
(barycenter of fan shape*area thereof))/total area (8)

$$G0 = \frac{2}{3} \cdot \frac{a\sin\phi(1 + \cos^2\phi)}{\phi + \cos\phi\sin\phi} \tag{9}$$

Therefore, information on size or a shape of an object such as the finger 2, specifically area or a degree of circularity of the object in calibration is beforehand registered, thereby position shift of the object may be corrected using such information, so that the true barycentric coordinates G may be calculated. Consequently, the same or equivalent advantage as in the first embodiment may be obtained, and even if the photosensor 12B is not disposed in the frame area A, an object position is corrected according to the above algorithm, thereby high position determination accuracy may be ensured.

While the invention has been described with the embodiments and the modifications hereinbefore, the invention is not limited to the embodiments and the like, and may be variously modified or altered. For example, while description has been exemplarily made with a configuration where the black display area is provided in a region corresponding to each of the shielding layers in the frame area A and the effective display area B, so that black display is continuously performed, the black display area may not be necessarily provided. That is, the black display electrode or the liquid crystal layer may not be formed in a region corresponding to the shielding layer. Even in the case of such a configuration, substantially the same advantage as in the embodiments of the invention may be obtained.

Figure 24:
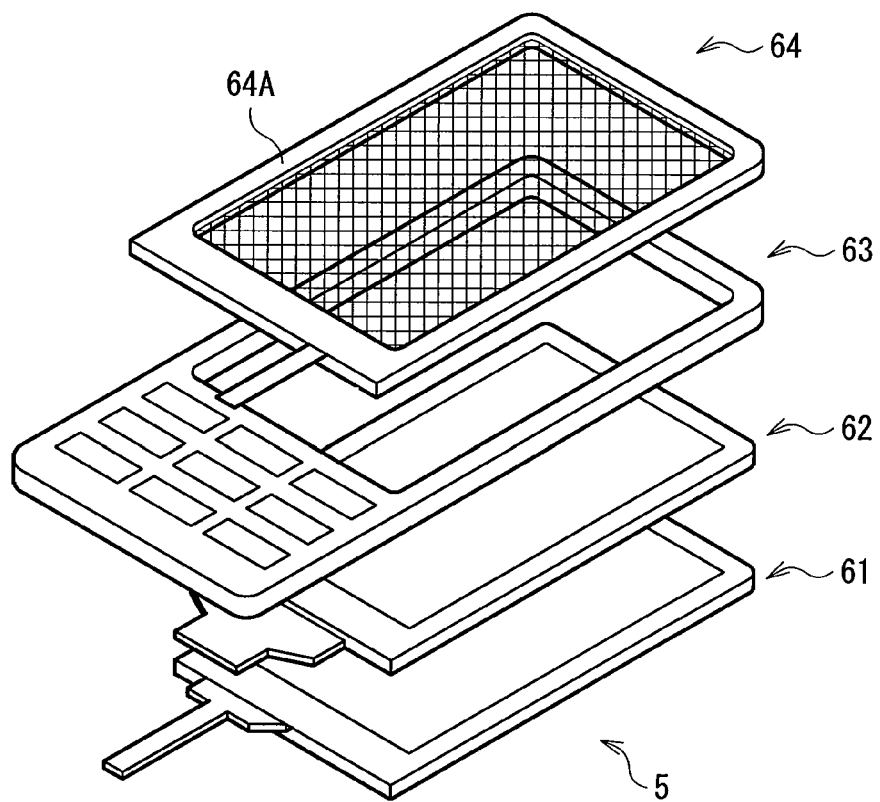
FIG. 24 is a perspective view showing an application example of the display panel of the embodiment of the invention.

Moreover, while the shielding layer selectively transmitting invisible light is provided in the frame area of the display panel in the embodiments, the shielding layer may be applied to another frame portion, for example, a frame portion of an electronic device 5 as shown in FIG. 24. The electronic device 5 is configured by stacking a display panel 62, a frame body 63, and a protective plate 64 in order from a side of a backlight 61. The shielding layer of the embodiments of the invention, which selectively transmits invisible light, may be provided on, for example, a frame 64A of the protective plate 64 disposed on a forefront side.

Figure 25A:
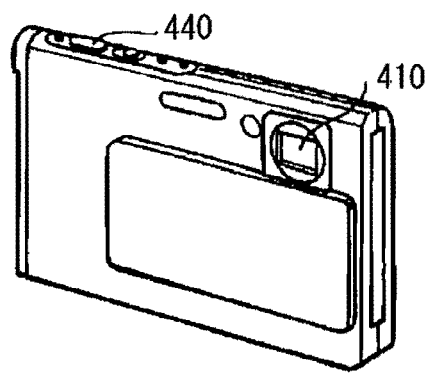
FIGS. 25A and 25B are perspective views showing another application example of the display panel of the embodiment of the invention.
Figure 25B:
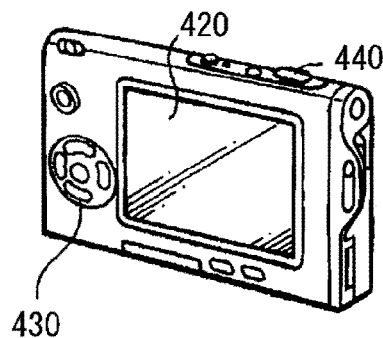
Figure 26:
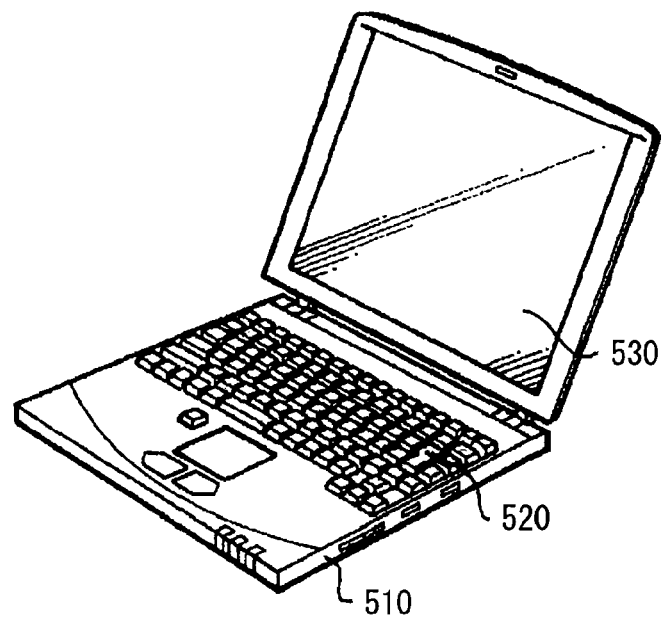
FIG. 26 is a perspective view showing another application example of the display panel of the embodiment of the invention.
Figure 27:
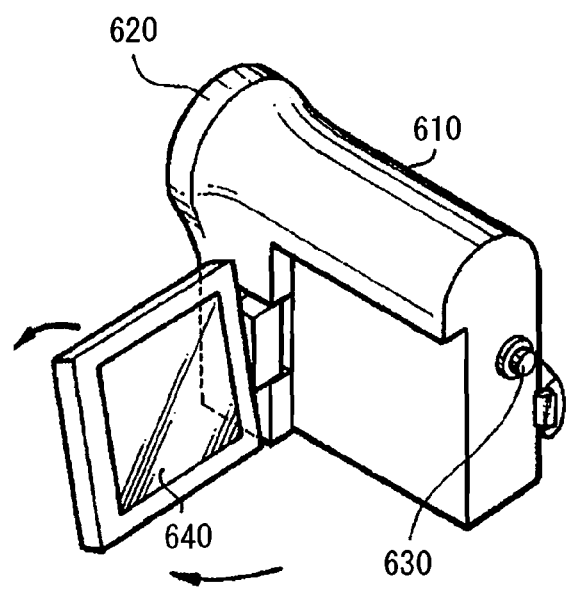
FIG. 27 is a perspective view showing another application example of the display panel of the embodiment of the invention.

Alternatively, the display panel of the embodiments of the invention may be applied to other electronic devices, for example, a digital still camera as shown in FIG. 25. The digital still camera has, for example, a light emitting section for flashlight 410, a display section 420, a menu switch 430, and a shutter-release button 440, and the display section 420 corresponds to the display panel of the embodiments of the invention. Moreover, the display panel may be applied to a notebook personal computer as shown in FIG. 26. The notebook personal computer has, for example, a body 510, a keyboard 520 for input operation of a letter or the like, and a display section 530 for displaying an image, and the display section 530 corresponds to the display panel of the embodiments of the invention. Furthermore, the display panel may be applied to a digital video camera as shown in FIG. 27. The digital video camera has, for example, a body 610, a lens 620 on a side face in the front of the body 610 for photographing an object, a start/stop switch 630 for photographing, and a display section 640, and the display section 640 corresponds to the display panel of the embodiments of the invention.

Furthermore, while description has been exemplarily made in the embodiments with a case where a polarizing plate on a display side of the display panel is exposed, and an object such as a finger is contacted to a top of the polarizing plate, still another member, for example, a protective plate may be provided on the polarizing plate. Moreover, since optical position detection as in the embodiments of the invention is performed by detecting light reflected on a surface of the object, even if the object is separated from a display screen or a module surface, position detection may be performed unlike resistance-type position detection or the like. That is, position detection may be performed not only in the case that an object is contacted to a module surface, but also in the case that the object is close to the module surface, as in the case in which the object is in contact with the module surface.

While the embodiments are exemplarily described with a liquid crystal display using a liquid crystal element, and an organic EL display using an organic EL element as a display device, the embodiments of the invention may be applied to other display devices, for example, e-paper using electrophoresis.

The present application contains subject matter related to that disclosed in Japanese Priority Patent Application JP 2008-329918 filed in the Japan Patent Office on Dec. 25, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalent thereof.

What is claimed is:

1. A display panel, comprising:
    image display elements disposed in an effective display area of a display screen, wherein the image display elements comprise liquid crystal elements, wherein the effective display area comprises a color filter layer of a plurality of colors;
    a first light-shielding layer disposed in a frame area around the effective display area, the first light-shielding layer transmitting invisible radiation while shielding visible light;
    a second light-shielding layer disposed in the effective display area, the second light-shielding layer transmitting invisible radiation while shielding visible light; and
    photo-detection elements disposed in the effective display area or in both of the effective display area and the frame area, wherein the photo-detection elements are disposed below the second light-shielding layer, the photo-detection elements detecting the invisible radiation,
    wherein a liquid crystal layer and a pair of electrodes applying a voltage to the liquid crystal layer are disposed in a region corresponding to the second light-shielding layer, thereby achieving a black display.

2. The display panel according to claim 1, wherein the liquid crystal elements comprise:
    a plurality of display pixel electrodes;
    a common electrode provided facing the display pixel electrodes; and
    the liquid crystal layer performing image display based on the visible light.

3. The display panel according to claim 1, further comprising, in the frame area, the liquid crystal layer, and the pair of electrodes applying the voltage to the liquid crystal layer to achieve the black display.

4. The display panel according to claim 1, wherein the photo-detection elements are disposed in the effective display area.

5. The display panel according to claim 1, wherein each of the image display elements has an organic Electro Luminescence (EL) layer emitting the visible light.

6. The display panel according to claim 1, wherein the invisible radiation is infrared light.

7. The display panel according to claim 1, wherein:
each of the image display elements has an organic Electro Luminescence (EL) layer emitting the invisible radiation, and
a color conversion layer converting part of the invisible radiation emitted from the organic EL layer into the visible light is disposed on a light outgoing side of the organic EL layer.

8. The display panel according to claim 7, wherein the invisible radiation is ultraviolet light.

9. The display panel according to claim 1, wherein the first light-shielding layer includes a resin layer dispersed with an organic pigment.

10. The display panel according to claim 1, wherein the first light-shielding layer comprises a plurality of stacked color filter layers which are different in color from one another.

11. The display panel according to claim 1, further comprising a position determination section determining a position of an object in contact with or close to the display screen based on output from the photo-detection elements.

12. A display panel, comprising:
image display elements disposed in an effective display area of a display screen;
a light-shielding layer disposed in a frame area around the effective display area, the light-shielding layer transmitting invisible radiation while shielding visible light;
photo-detection elements disposed in the effective display area or in both of the effective display area and the frame area, the photo-detection elements detecting the invisible radiation; and
a position determination section determining a position of an object in contact with or close to the display screen based on outputs from the photo-detection elements,
wherein the position determination section calculates barycentric coordinates of the object based on intensity distribution of invisible radiation detected by the photo-detection elements, thereby determining the position of the object.

13. The display panel according to claim 12, wherein:
the photo-detection elements are disposed only in the effective display area, and
the position determination section corrects the calculated barycentric coordinates by using information on size or a shape of the object.

14. A module, comprising:
a light source emitting invisible radiation and visible light;
image display elements disposed in an effective display area of a display screen, wherein the image display elements comprise liquid crystal elements, wherein the effective display area comprises a color filter layer of a plurality of colors;
a first light-shielding layer disposed in a frame area around the effective display area, the first light-shielding layer transmitting the invisible radiation from the light source while shielding the visible light from the light source;
a second light-shielding layer disposed in the effective display area, the second light-shielding layer transmitting invisible radiation while shielding visible light; and
photo-detection elements disposed in the effective display area or in both the effective display area and the frame area, wherein the photo-detection elements are disposed below the second light-shielding layer, the photo-detection elements detecting the invisible radiation,
wherein a liquid crystal layer and a pair of electrodes applying a voltage to the liquid crystal layer are disposed in a region corresponding to the second light-shielding layer, thereby achieving a black display.

15. An electronic device, comprising:
a light source emitting invisible radiation and visible light;
image display elements disposed in an effective display area of a display screen, wherein the image display elements are configured of liquid crystal elements, wherein the effective display area comprises a color filter layer of a plurality of colors;
a first light-shielding layer disposed in a frame area around the effective display area, the first light-shielding layer transmitting the invisible radiation from the light source while shielding the visible light from the light source;
a second light-shielding layer disposed in the effective display area, the second light-shielding layer transmitting invisible radiation while shielding visible light; and
photo-detection elements disposed in the effective display area or in both of the effective display area and the frame area, wherein the photo-detection elements are disposed below the second light-shielding layer, the photo-detection elements detecting the invisible radiation,
wherein a liquid crystal layer and a pair of electrodes applying a voltage to the liquid crystal layer are disposed in a region corresponding to the second light-shielding layer, thereby achieving a black display.

16. The electronic device of claim 15, wherein the photo-detection elements are disposed in both the effective display area and the frame area.

17. The electronic device of claim 15, wherein the liquid crystal elements comprise:
a plurality of display pixel electrodes;
a common electrode provided facing the display pixel electrodes; and
the liquid crystal layer performing image display based on the visible light.

18. The electronic device of claim 15, further comprising, in the frame area, the liquid crystal layer, and the pair of electrodes applying a voltage to the liquid crystal layer to achieve the black display.

19. The electronic device of claim 15, wherein the photo-detection elements are disposed in the effective display area.

* * * * *